United States Patent
Sugimura et al.

(10) Patent No.: US 11,732,190 B2
(45) Date of Patent: Aug. 22, 2023

(54) CHEMICAL SOLUTION, METHOD FOR MANUFACTURING CHEMICAL SOLUTION, AND METHOD FOR TREATING SUBSTRATE

(71) Applicant: FUJIFILM Corporation, Tokyo (JP)

(72) Inventors: Nobuaki Sugimura, Shizuoka (JP); Tomonori Takahashi, Shizuoka (JP); Hiroyuki Seki, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/940,515

(22) Filed: Jul. 28, 2020

(65) Prior Publication Data

US 2020/0354632 A1    Nov. 12, 2020

Related U.S. Application Data

(63) Continuation of application No. PCT/JP2019/001452, filed on Jan. 18, 2019.

(30) Foreign Application Priority Data

Feb. 5, 2018  (JP) ................................. 2018-018459
Aug. 29, 2018  (JP) ................................. 2018-160719

(51) Int. Cl.
*C09K 13/04* (2006.01)
*H01L 21/02* (2006.01)
*H01L 21/3213* (2006.01)

(52) U.S. Cl.
CPC ........ *C09K 13/04* (2013.01); *H01L 21/02071* (2013.01); *H01L 21/32134* (2013.01)

(58) Field of Classification Search
CPC ... C09K 13/04; C09K 13/06; H01L 21/02071; H01L 21/32134; H01L 21/02087;
(Continued)

(56) References Cited

U.S. PATENT DOCUMENTS

2004/0206634 A1    10/2004 Shirakashi et al.
2005/0070109 A1    3/2005 Feller et al.
(Continued)

FOREIGN PATENT DOCUMENTS

CN    1900206 A    1/2007
CN    105297022 A    2/2016
(Continued)

OTHER PUBLICATIONS

Communication dated Apr. 20, 2021 in Japanese Application No. 2019-568998.
(Continued)

*Primary Examiner* — Duy Vu N Deo
(74) *Attorney, Agent, or Firm* — Sughrue Mion, PLLC

(57) ABSTRACT

The present invention provides a chemical solution, which demonstrates excellent etching performance for transition metal-containing substances and has excellent defect inhibition performance, a method for manufacturing the chemical solution, and a method for treating a substrate. The chemical solution according to an embodiment of the present invention includes one or more kinds of periodic acids selected from the group consisting of a periodic acid and a salt thereof, one or more kinds of first metal components selected from the group consisting of Ti and Zr, and water. In a case where the chemical solution includes one kind of first metal component, a content of the one kind of first metal component is 1 ppt by mass to 100 ppm by mass with respect to a total mass of the periodic acids. In a case where the chemical solution includes two kinds of first metal components, a content of both the two kinds of first metal components is equal to or smaller than 100 ppm by mass with respect to the total mass of the periodic acids, and a content of at least one of the two kinds of first metal components is
(Continued)

equal to or greater than 1 ppt by mass with respect to the total mass of the periodic acids.

46 Claims, 1 Drawing Sheet

(58) Field of Classification Search
 CPC .. H01L 21/0209; H01L 21/02068; C23F 1/30; C23F 1/28; C23F 1/26; C23F 1/40; C23F 1/38; B01J 43/00; B01J 47/12; B01D 35/02
 USPC ......................................................... 438/754
 See application file for complete search history.

(56) References Cited

U.S. PATENT DOCUMENTS

| | | | |
|---|---|---|---|
| 2007/0007196 A1 | 1/2007 | Komatsu et al. | |
| 2011/0230053 A1 | 9/2011 | Matsuda et al. | |
| 2017/0342304 A1* | 11/2017 | Ashitaka | H01L 21/31053 |
| 2019/0136161 A1 | 5/2019 | Kamimura et al. | |

FOREIGN PATENT DOCUMENTS

| | | | | |
|---|---|---|---|---|
| CN | 107207945 A | | 9/2017 | |
| JP | 5-039586 A | | 2/1993 | |
| JP | 11-293478 A | | 10/1999 | |
| JP | 2001-240985 A | | 9/2001 | |
| JP | 2004-330056 A | | 11/2004 | |
| JP | 2007-508692 A | | 4/2007 | |
| JP | 2007-185581 A | | 7/2007 | |
| JP | 2008-160134 A | | 7/2008 | |
| JP | 2012-044118 A | | 3/2012 | |
| JP | 2012-080128 A | | 4/2012 | |
| JP | 2015-195376 A | | 11/2015 | |
| JP | 2016-092101 A | | 5/2016 | |
| KR | 20160012947 A | * | 2/2016 | ............ C09K 13/00 |
| KR | 10-2017-0105515 A | | 9/2017 | |
| TW | I286568 B | * | 9/2007 | ........... C09K 3/1463 |
| TW | 201631645 A | | 9/2016 | |
| WO | 2017/126554 A1 | | 7/2017 | |
| WO | 2018/021038 A1 | | 2/2018 | |

OTHER PUBLICATIONS

International Search Report dated Mar. 5, 2019 in International Application No. PCT/JP2019/001452.
Written Opinion of the International Searching Authority dated Mar. 5, 2019 in International Application No. PCT/JP2019/001452.
International Preliminary Report on Patentability dated Aug. 11, 2020 in International Application No. PCT/JP2019/001452.
Office Action dated Jul. 28, 2022 from the Korean Intellectual Property Office in KR Application No. 10-2020-7021653.
Communication dated Apr. 18, 2022, issued by Taiwanese Patent Office in Taiwanese Application No. 108103328.
Notification of Reason for Refusal dated Nov. 4, 2021 from the Korean Intellectual Property Office in KR Application No. 10-2020-7021653.
Notice of Reasons for Cancellation dated Aug. 2, 2022 in Japanese Opposition No. 2022-700331.
Communication dated Aug. 29, 2022, issued in Taiwanese Application No. 108103328.
Notice of Reasons for Cancellation dated Feb. 8, 2023 issued by Japanese Patent Office in Japanese Patent No. 6960477B.
Chinese Office Action dated Jan. 19, 2023 issued by China National Intellectual Property Administration in Chinese Application No. 201980011921.9.

\* cited by examiner

CHEMICAL SOLUTION, METHOD FOR MANUFACTURING CHEMICAL SOLUTION, AND METHOD FOR TREATING SUBSTRATE

CROSS-REFERENCE TO RELATED APPLICATIONS

This application is a Continuation of PCT International Application No. PCT/JP2019/001452 filed on Jan. 18, 2019, which claims priority under 35 U.S.C. § 119(a) to Japanese Patent Application No. 2018-018459 filed on Feb. 5, 2018 and Japanese Patent Application No. 2018-160719 filed on Aug. 29, 2018. Each of the above applications is hereby expressly incorporated by reference, in its entirety, into the present application.

BACKGROUND OF THE INVENTION

1. Field of the Invention

The present invention relates to a chemical solution, a method for manufacturing a chemical solution, and a method for treating a substrate.

2. Description of the Related Art

As the miniaturization of semiconductor products progresses, there is an increasing demand for performing a step of removing unnecessary transition metal-containing substances on a substrate in a semiconductor product manufacturing process with high efficiency and high accuracy.

JP2016-092101A describes "method for treating a substrate on which a ruthenium-containing film is formed, including a step of removing ruthenium deposits attached to the outer edge portion of a surface of the substrate on which the ruthenium-containing film is formed and/or ruthenium deposits attached to a back surface of the substrate by using a remover solution, wherein a content of orthoperiodic acid in the remover solution with respect to a total mass of the remover solution is 0.05% to 8% by mass, and a pH of the remover solution is equal to or lower than 3.5 (claim 1)".

SUMMARY OF THE INVENTION

In recent years, it has been increasingly required that excellent etching performance is demonstrated in a case where unnecessary transition metal-containing substances on a substrate are removed using a chemical solution. Particularly, it has been required that excellent etching performance is demonstrated for an object to be treated including ruthenium (Ru).

Furthermore, it has been required that in a case where a chemical solution is used, the occurrence of defects on a substrate for which the chemical solution is used is further inhibited. In a case where defects occur on a substrate, an electrical fault tends to occur between wirings arranged on the substrate, which leads to a decrease in yield.

Therefore, an object of the present invention is to provide a chemical solution which demonstrates excellent etching performance for transition metal-containing substances and has excellent defect inhibition performance.

Another object of the present invention is to provide a method for manufacturing the chemical solution and a method for treating a substrate.

In order to achieve the above objects, the inventors of the present invention conducted intensive examinations. As a result, the inventors have found that by a predetermined chemical solution, the above objects can be achieved, and have accomplished the present invention.

That is, the inventors have found that the above objects can be achieved by the following constitution.

[1] A chemical solution including one or more kinds of periodic acids selected from the group consisting of a periodic acid and a salt thereof, one or more kinds of first metal components selected from the group consisting of Ti and Zr, and water, in which in a case where the chemical solution includes one kind of first metal component, a content of the one kind of first metal component is 1 ppt by mass to 100 ppm by mass with respect to a total mass of the periodic acids, and in a case where the chemical solution includes two kinds of first metal components, a content of both the two kinds of first metal components is equal to or smaller than 100 ppm by mass with respect to the total mass of the periodic acids, and a content of at least one of the two kinds of first metal components is equal to or greater than 1 ppt by mass with respect to the total mass of the periodic acids.

[2] The chemical solution described in [1], in which in a case where the chemical solution includes one kind of first metal component, a content of the one kind of first metal component is 1 ppb by mass to 100 ppb by mass with respect to the total mass of the periodic acids, and in a case where the chemical solution includes two kinds of first metal components, a content both the two kinds of first metal components is equal to or smaller than 100 ppb by mass with respect to the total mass of the periodic acids, and a content of at least one of the two kinds of first metal components is equal to or greater than 1 ppb by mass with respect to the total mass of the periodic acids.

[3] The chemical solution described in [1] or [2], further including a pH adjuster.

[4] The chemical solution described in any one of [1] to [3] that has a pH of 4.0 to 9.0.

[5] The chemical solution described in any one of [1] to [3] that has a pH of 7.5 to 10.0.

[6] The chemical solution described in any one of [1] to [5], in which a content of the periodic acids with respect to a total mass of the chemical solution is 0.0001% to 50% by mass.

[7] The chemical solution described in any one of [1] to [6], further including one or more kinds of second metal components selected from the group consisting of Al, Ag, B, Ba, Ca, Cd, Co, Cr, Cu, Fe, K, Li, Mg, Mn, Na, Ni, Pb, Ru, Sn, and Zn, in which in a case where the chemical solution includes one kind of second metal component, a content of the one kind of second metal component is 1 ppt by mass to 100 ppm by mass with respect to the total mass of the periodic acids, and in a case where the chemical solution includes two or more kinds of second metal components, a content of all of the two or more kinds of second metal components is equal to or smaller than 100 ppm by mass with respect to the total mass of the periodic acids, and a content of at least one of the two or more kinds of second metal components is equal to or greater than 1 ppt by mass with respect to the total mass of the periodic acids.

[8] The chemical solution described in any one of [1] to [7], further including ammonium ions, in which a content of the ammonium ions is 1 ppt by mass to 100 ppm by mass with respect to the total mass of the periodic acids.

[9] The chemical solution described in any one of [1] to [8], further including one or more kinds of anionic species selected from the group consisting of I$^-$, I$_3^-$, IO$_3^-$, Br$^-$, Cl$^-$, NO$_3^-$, a sulfate ion, a sulfite ion, a phosphate ion, and a phosphite ion, in which in a case where the chemical solution includes one kind of anionic species, a content of the one kind of anionic species is 1 ppt by mass to 100 ppm by mass with respect to the total mass of the periodic acids, and in a case where the chemical solution includes two or more kinds of anionic species, a content of all of the two or more kinds of anionic species is equal to or smaller than 100 ppm by mass with respect to the total mass of the periodic acids, and a content of at least one of the two or more kinds of anionic species is equal to or greater than 1 ppt by mass with respect to the total mass of the periodic acids.

[10] The chemical solution described in [9], in which the anionic species is IO$_3^-$.

[11] A method for manufacturing a chemical solution, including a step A of performing an ion exchange method on a substance to be purified, which includes one or more kinds of periodic acids selected from the group consisting of a periodic acid and a salt thereof, one or more kinds of first metal components selected from the group consisting of Ti and Zr, and water, so as to obtain the chemical solution described in any one of [1] to [10].

[12] The method for manufacturing a chemical solution described in [11], in which the ion exchange method includes one or more kinds of methods selected from the group consisting of a method A1 of passing the substance to be purified through a first filled portion filled with a mixed resin including a cation exchange resin and an anion exchange resin, a method A2 of passing the substance to be purified through at least one kind of filled portion among a second filled portion filled with a cation exchange resin, a third filled portion filled with an anion exchange resin, and a fourth filled portion filled with a chelating resin, and a method A3 of passing the substance to be purified through a membranous ion exchanger.

[13] The method for manufacturing a chemical solution described in [12], in which the method A1 is a method of passing the substance to be purified through two or more of the first filled portions.

[14] The method for manufacturing a chemical solution described in [12] or [13], in which the method A2 is a method of passing the substance to be purified through two or more of the second filled portions and two or more of the third filled portions, or a method of passing the substance to be purified through one or more of the second filled portions and one or more of the fourth filled portions.

[15] The method for manufacturing a chemical solution described in any one of [12] to [14], in which the method A3 is a method of passing the substance to be purified through two or more membranous ion exchangers.

[16] The method for manufacturing a chemical solution described in any one of [12] to [15], in which the ion exchange method includes two or more kinds of methods selected from the group consisting of the method A1, the method A2, and the method A3.

[17] The method for manufacturing a chemical solution described in any one of [11] to [16], further including a step B of filtering the substance to be purified having undergone the step A by using a filter after the step A.

[18] The method for manufacturing a chemical solution described in any one of [11] to [17], further including a step C of mixing the substance to be purified with a pH adjuster before the step A.

[19] A method for treating a substrate, including a step D of removing a transition metal-containing substance on a substrate by using the chemical solution described in any one of [1] to [10].

[20] The method for treating a substrate described in [19], in which in the step D, two or more kinds of transition metal-containing substances on the substrate are simultaneously removed.

[21] The method for treating a substrate described in [20], in which the two or more kinds of transition metal-containing substances include at least a Ru-containing substance and a Cu-containing substance.

[22] The method for treating a substrate described in any one of [19] to [21], further including performing a rinsing treatment on the substrate obtained by the step D by using a rinsing solution after the step D.

[23] The method for treating a substrate described in [22], in which the rinsing solution is an acidic rinsing solution.

According to the present invention, it is possible to provide a chemical solution which demonstrates excellent etching performance for transition metal-containing substances and has excellent defect inhibition performance.

Furthermore, according to the present invention, it is possible to provide a method for manufacturing the chemical solution and a method for treating a substrate.

DESCRIPTION OF THE PREFERRED EMBODIMENTS

Figure 1:
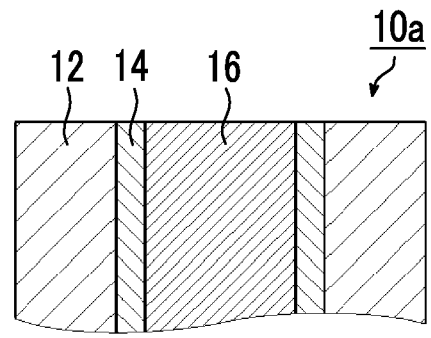
FIG. 1 is a schematic cross-sectional top view showing an example of an object to be treated used in a step D1.

Hereinafter, the present invention will be specifically described.

The following constituents will be described based on typical embodiments of the present invention in some cases, but the present invention is not limited to the embodiments.

In the present specification, in a case where there is no description regarding whether a group (atomic group) is substituent or unsubstituted, as long as the effects of the present invention are not reduced, the group includes both the group having no substituent and the group having a substituent. For example, "alkyl group" includes not only an alkyl group having no substituent (unsubstituted alkyl group) but also an alkyl group having a substituent (substituted alkyl group). The same is true of each compound.

In the present specification, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", and "ppt" means "parts-per-trillion ($10^{-12}$)".

In the present invention, 1 Å (angstrom) equals 0.1 nm.

[Chemical Solution]

The chemical solution according to an embodiment of the present invention includes one or more kinds of periodic acids selected from the group consisting of periodic acid and a salt thereof, one or more kinds of first metal components selected from the group consisting of Ti and Zr, and water, in which the amount of the first metal components is within a predetermined range.

The mechanism through which the objects of the present invention are achieved by the chemical solution constituted as above is unclear. According to the inventors of the present invention, the mechanism is assumed to be as follows.

The inventors of the present invention assume that in a case where a predetermined amount of periodic acids act as a main dissolver liquid in an etching solution for a transition metal-containing substance, and the etching solution includes at least one of the first metal components in an amount equal to or greater than a predetermined amount, the first metal component included in an amount equal to or greater than a predetermined amount may play as a catalyst, and thus excellent etching performance of the chemical solution may be realized.

The inventors of the present invention assume that meanwhile, because the content of the first metal component in the chemical solution according to the embodiment of the present invention is equal to or smaller than a predetermined amount, metal atoms of the first metal component and the like may hardly remain on an object to be treated that has been treated using the chemical solution, and thus the occurrence of defects could be inhibited. In a case where the occurrence of defects is inhibited as described above, even though the chemical solution according to the embodiment of the present invention is used for manufacturing a wiring substrate, an electrical fault such as the electrical conduction between wiring hardly occurs on the wiring substrate, and the manufacturing yield of the wiring substrate is improved.

<One or More Kinds of Periodic Acids Selected from Group Consisting of Periodic Acid and Salt Thereof>

The chemical solution according to the embodiment of the present invention includes one or more kinds of periodic acids selected from the group consisting of a periodic acid and a salt thereof (salt of a periodic acid).

As the periodic acids, one or more kinds of compounds selected from the group consisting of orthoperiodic acid ($H_5IO_6$), a salt of orthoperiodic acid, metaperiodic acid ($HIO_4$), and a salt of metaperiodic acid salt are preferable. Among these, orthoperiodic acid is preferable because it does not include an alkali metal such as sodium ($Na^+$) and the composition thereof is stable.

In view of excellent etching performance of the chemical solution, the content (total content) of the periodic acids with respect to the total mass of the chemical solution is preferably 0.0001% to 50% by mass, more preferably 1% to 45% by mass, even more preferably 2% to 40% by mass, and particularly preferably 4% to 40% by mass.

The concentration of the periodic acids in the chemical solution is measured, for example, by ion chromatography. Specifically, examples of the device include Dionex ICS-2100 manufactured by Thermo Fisher Scientific Inc.

In addition, in a case where the components of the used raw materials are known, the concentration of the periodic acids may be calculated from the amount thereof mixed together.

<One or More Kinds of First Metal Components Selected from Group Consisting of Ti and Zr>

The chemical solution according to the embodiment of the present invention includes one or more kinds of first metal components selected from the group consisting of Ti and Zr. As will be specifically described later, the first metal component may be separately added at the time of preparing the chemical solution according to the embodiment of the present invention. In some cases, the first metal component may be incorporated as a minor component into the raw materials of the periodic acids. In these cases, as will be described later, the content of the first metal component can be reduced by an ion exchange method and adjusted to fall into a predetermined range. Presumably, as the reason why the first metal component is mixed into the raw materials of the periodic acids, it is possible to consider a case where the first metal component is used as a catalyst at the time of synthesizing the periodic acids and then remains as it is, a case where the component attached to piping is mixed into the raw materials of the periodic acids during the manufacturing process of the periodic acids, and the like.

In the present specification, "first metal component" means a metal component in a chemical solution that can be measured using a single-particle inductively coupled plasma emission mass spectrometer. By the above device, the content of each of the metals as particles (metals in the form of particles) and other metals (for example, ions and the like) and the total content of these can be measured. That is, the first metal component may be in the form of particles or in an ionic state.

In the present specification, the metal components (the first metal component and the second metal component which will be described later) can be measured by the method described in Examples by using, for example, Agilent 8800 triple quadrupole inductively coupled plasma mass spectrometry (ICP-MS, for semiconductor analysis, option #200) manufactured by Agilent Technologies, Inc.

In a case where the chemical solution includes one kind of first metal component, the content of the one kind of first metal component is 1 ppt by mass to 100 ppm by mass with respect to the total mass of the periodic acids. That is, in a case where the chemical solution includes either Ti or Zr as the first metal component, the content of the first metal component is 1 ppt by mass to 100 ppm by mass (preferably 1 ppb by mass to 100 ppb by mass) with respect to the total mass of the periodic acids.

Particularly, in view of further improving the etching performance of the chemical solution, the content is preferably equal to or greater than 1 ppb by mass. Furthermore, in view of further improving the defect inhibition performance of the chemical solution, the content is preferably equal to or smaller than 100 ppb by mass, more preferably equal to or smaller than 10 ppb by mass, and even more preferably equal to or smaller than 5 ppb by mass.

In a case where the chemical solution includes two kinds of first metal components (Ti and Zr), the content of the two kinds of first metal components (the content of both the two kinds of first metal components) is equal to or smaller than 100 ppm by mass with respect to the total mass of the periodic acids. Particularly, in view of further improving the defect inhibition performance of the chemical solution, the content of both the two kinds of first metal components is preferably equal to or smaller than 100 ppb by mass, more preferably equal to or smaller than 10 ppb by mass, and even more preferably equal to or smaller than 5 ppb by mass.

In a case where the chemical solution includes two kinds of first metal components (Ti and Zr), the content of at least one of the two kinds of first metal components (content of one kind of first metal component between the two kinds of first metal components) is equal to or greater than 1 ppt by mass with respect to the total mass of the periodic acids.

Particularly, in view of further improving the etching performance of the chemical solution, the content of at least one of the two kinds of first metal components is preferably equal to or greater than 1 ppb by mass.

As described above, in a case where the chemical solution includes two kinds of first metal components (Ti and Zr), the content of at least one of the two kinds of first metal components may be equal to or greater than 1 ppt by mass. In other words, in a case where the chemical solution includes two kinds of first metal components (Ti and Zr), the content of one of the two kinds of first metal components may be equal to or greater than 1 ppt by mass and equal to or smaller than 100 ppm by mass with respect to the total mass of the periodic acids, and the content of the other kind of first metal component may be greater than 0 ppt by mass and equal to or smaller than 100 ppm by mass (preferably equal to or greater than 0.1 ppt by mass and equal to or smaller than 100 ppm by mass).

In a case where the chemical solution includes two kinds of first metal components (Ti and Zr), in view of further improving the etching performance of the chemical solution, the content of the two kinds of first metal components (the content of both the two kinds of first metal components) with respect to the total mass of the periodic acids is preferably equal to or greater than 1 ppt by mass, and more preferably equal to or greater than 1 ppb by mass.

<Water>

The chemical solution includes water.

Water may include a trace of components that are unavoidably mixed in. Particularly, water having undergone a purification treatment such as distilled water, deionized water, or ultrapure water is preferable, and ultrapure water used for manufacturing semiconductors is more preferable.

The concentration of water in the chemical solution is not particularly limited, but is preferably equal to or higher than 40% by mass, more preferably equal to or higher than 50% by mass, and even more preferably equal to or higher than 60% by mass. The upper limit thereof is not particularly limited, but is preferably equal to or lower than 99.95% by mass, more preferably equal to or lower than 99% by mass, and even more preferably equal to or lower than 95% by mass.

<Optional Components>

The chemical solution may include other optional components in addition to the components described above. Hereinafter, the optional components will be described.

(pH Adjuster)

The chemical solution according to the embodiment of the present invention may include a pH adjuster.

Examples of the pH adjuster include an organic base, an inorganic base, an organic acid, and an inorganic acid. Among these, an organic base or an inorganic base is preferable, and an organic base is more preferable.

Specific examples of the pH adjuster include a quaternary ammonium salt compound, an amidine compound, and a water-soluble amine.

As the quaternary ammonium salt compound, a compound represented by Formula (1) is preferable.

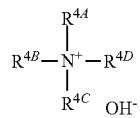

Formula (1)

In Formula (1), $R^{4A}$ to $R^{4D}$ each independently represent an alkyl group having 1 to 6 carbon atoms, a hydroxyalkyl group having 1 to 6 carbon atoms, a benzyl group, or an aryl group.

In Formula (1), $R^{4A}$ to $R^{4D}$ each independently represent an alkyl group having 1 to 6 carbon atoms (for example, a methyl group, an ethyl group, a butyl group, or the like), a hydroxyalkyl group having 1 to 6 carbon atoms (for example, a hydroxymethyl group, a hydroxyethyl group, a hydroxybutyl group, or the like), a benzyl group, or an aryl group (for example, a phenyl group, a naphthyl group, a naphthalene group, or the like). Among these, an alkyl group, a hydroxyethyl group, or a benzyl group is preferable.

As the compound represented by Formula (1), at least one kind of quaternary ammonium hydroxide salt is preferable which is selected from the group consisting of tetramethylammonium hydroxide (TMAH), tetraethylammonium hydroxide (TEAH), tetrabutylammonium hydroxide (TBAH), trimethylhydroxyethylammonium hydroxide, methyltri(hydroxyethyl)ammonium hydroxide, tetra(hydroxyethyl)ammonium hydroxide, trimethylbenzylammonium hydroxide, and choline. Among these, as the compound represented by Formula (1), at least one kind of compound is more preferable which is selected from the group consisting of tetramethylammonium hydroxide, tetraethylammonium hydroxide, and tetrabutylammonium hydroxide.

One kind of quaternary ammonium salt compound may be used singly, or two or more kinds of quaternary ammonium salt compounds may be used.

Examples of the amidine compound include acetamidine, imidazotan, 2-methylimidazole, 1,4,5,6-tetrahydropyrimidine, 2-methyl-1,4,5,6-tetrahydropyrimidine, 2-phenyl-1,4,5,6-tetrahydropyrimidine, iminopiperidine, diazabicyclononene, diazabicycloundecene (DBU), and the like. Among these, diazabicycloundecene is preferable.

A pka of the water-soluble amine is preferably 7.5 to 13.0. In the present specification, the water-soluble amine means an amine which can dissolve in an amount equal to or greater than 1.0 g in 1 L of water. Aqueous ammonia is not included in the water-soluble amine.

Examples of the water-soluble amine having a pKa of 7.5 to 13 include diglycolamine (DGA) (pKa=9.80), methylamine (pKa=10.6), ethylamine (pKa=10.6), propylamine (pKa=10.6), butylamine (pKa=10.6), pentylamine (pKa=10.0), ethanolamine (pKa=9.3), propanolamine (pKa=9.3), butanol amine (pKa=9.3), methoxyethylamine (pKa=10.0), methoxypropylamine (pKa=10.0), dimethylamine (pKa=10.8), diethylamine (pKa=10.9), diamine propylamine (pKa=10.8), trimethylamine (pKa=9.80), and triethylamine (pKa=10.72).

As the water-soluble amine, unsubstituted hydroxylamine and a hydroxylamine derivative may also be used.

In the present specification, the pka of the water-soluble amine is an acid dissociation constant in water. The acid dissociation constant in water can be measured using a spectrometer and potentiometry in combination.

Among these, as a pH adjuster, tetramethylammonium hydroxide, tetraethylammonium hydroxide, tetrabutylammonium hydroxide, or diazabicycloundecene is preferable.

(Second Metal Component)

The chemical solution may include a metal component other than the first metal component.

The chemical solution may include one or more kinds of second metal components selected from the group consisting of Al, Ag, B, Ba, Ca, Cd, Co, Cr, Cu, Fe, K, Li, Mg, Mn, Na, Ni, Pb, Ru, Sn, and Zn.

In some cases, boron (B) is classified as a semimetal. However, in the present specification, boron is regarded as a metal.

In the present specification, "second metal component" means a metal component in a chemical solution that can be measured using a single-particle inductively coupled plasma emission mass spectrometer. By the above device, the content of each of the metals as particles (metals in the form of particles) and other metals (for example, ions and the like) and the total content of these can be measured. That is, the second metal component may be in the form of particles or in an ionic state.

In a case where the chemical solution includes one kind of second metal component, the content of the one kind of second metal component is preferably 1 ppt by mass to 100 ppm by mass (more preferably 1 ppb by mass to 100 ppb by mass) with respect to the total mass of the periodic acids.

In a case where the chemical solution includes two or more kinds of second metal components, the content of all of the two or more kinds of second metal components is equal to or smaller than 100 ppm by mass (more preferably equal to or smaller than 100 ppb by mass) with respect to the total mass of the periodic acids, and the content of at least one of the two or more kinds of second metal components is equal to or greater than 1 ppt by mass (more preferably equal to or greater than 1 ppb by mass) with respect to the total mass of the periodic acids.

In other words, in a case where the chemical solution includes two or more kinds of second metal components, at least one of the two or more kinds of second metal components is preferably equal to or greater than 1 ppt by mass and equal to or smaller than 100 ppm by mass with respect to the total mass of the periodic acids, and the content of other second metal components among the two or more kinds of second metal components is preferably greater than 0 ppt by mass and equal to or smaller than 100 ppm by mass (more preferably equal to or greater than 0.1 ppt by mass and equal to or smaller than 100 ppm by mass).

Furthermore, in a case where the chemical solution includes two or more kinds of second metal components, the content of all of the two or more kinds of second metal components with respect to the total mass of the periodic acids is preferably equal to or greater than 1 ppt by mass, and more preferably equal to or greater than 1 ppb by mass.

(Ammonium Ions)

In view of further improving the etching performance, the chemical solution may include ammonium ions ($NH_4^+$).

The content of the ammonium ions with respect to the total mass of the periodic acids is, for example, preferably 1 ppt by mass to 100 ppm by mass, and more preferably 1 ppb by mass to 1 ppm by mass.

(Anionic Species)

In view of improving the smoothness (roughness) of a portion to be treated, the chemical solution may include one or more kinds of anionic species selected from the group consisting of $I^-$, $I_3^-$, $IO_3^-$, $Br^-$, $Cl^-$, $NO_3^-$, a sulfate ion, a sulfite ion, a phosphate ion, and a phosphite ion. As the anionic species, $IO_3^-$ is preferable.

In a case where the chemical solution includes one kind of anionic species, the content of the one kind of anionic species is preferably 1 ppt by mass to 100 ppm by mass (more preferably 1 ppb by mass to 1 ppm by mass) with respect to the total mass of the periodic acids.

In a case where the chemical solution includes two or more kinds of anionic species, the content of all of the two or more kinds of anionic species is equal to or smaller than 100 ppm by mass (more preferably equal to or smaller than 1 ppm by mass) with respect to the total mass of the periodic acids, and the content of at least one of the two or more kinds of anionic species is equal to or greater than 1 ppt by mass (more preferably equal to or greater than 1 ppb by mass) with respect to the total mass of the periodic acids.

In other words, in a case where the chemical solution includes two or more kinds of anionic species, the content of at least one of the two or more kinds of anionic species is preferably equal to or greater than 1 ppt by mass and equal to or smaller than 100 ppm by mass with respect to the total mass of the periodic acids, and the content of all of other anionic species among the two or more kinds of anionic species is preferably greater than 0 ppt by mass and equal to or smaller than 100 ppm by mass (more preferably equal to or greater than 0.1 ppt by mass and equal to or smaller than 100 ppm by mass).

Furthermore, in a case where the chemical solution includes two or more kinds of anionic species, the content of all of the two or more kinds of anionic species with respect to the total mass of the periodic acids is preferably equal to or greater than 1 ppt by mass, and more preferably equal to or greater than 1 ppb by mass.

Particularly, the chemical solution preferably includes $IO_3^-$ as the anionic species, and the content of $IO_3^-$ in the chemical solution is preferably 1 ppt by mass to 100 ppm by mass (more preferably 1 ppb by mass to 1 ppm by mass) with respect to the total mass of the periodic acids.

The content of the ammonium ions and the anionic species can be determined, for example, by ion chromatography.

Specifically, examples of the device include Dionex ICS-2100 manufactured by Thermo Fisher Scientific Inc.

In addition, in a case where the components of the used raw materials are known, the concentration of the periodic acids may be calculated from the amount thereof mixed together.

(Carboxylic Acid Compound)

It is also preferable that the chemical solution according to the embodiment of the present invention further includes a carboxylic acid compound.

The carboxylic acid compound is a compound having one or more carboxy groups or a salt thereof.

The carboxylic acid compound acts as an agent for improving the residue removability of the chemical solution, a flatness enhancer, and the like.

The carboxylic acid compound effectively prevents the corrosion of metals such as aluminum, copper, and alloys of these.

It is also preferable that the carboxylic acid compound acts as a chelating agent that exerts a chelating effect on metals (for example, aluminum, copper, and alloys of these).

As the carboxylic acid compound (preferably, a carboxylic acid compound acting as a chelating agent) included in the chemical solution according to the embodiment of the present invention, a carboxylic acid compound having no nitrogen atom is particularly preferable.

Examples of the carboxylic acid compound having no nitrogen atom include citric acid, lactic acid, acetic acid, propionic acid, malic acid, tartaric acid, malonic acid, oxalic acid, succinic acid, gluconic acid, glycolic acid, diglycolic acid, maleic acid, benzoic acid, phthalic acid, salicylic acid, salicylhydroxamic acid, phthalhydroxamic acid, formic acid, and salts of these.

Among these, citric acid, lactic acid, acetic acid, malic acid, tartaric acid, malonic acid, oxalic acid, glycolic acid, phthalic acid, salicylhydroxamic acid, or phthalhydroxamic acid is preferable.

Examples of carboxylic acid compounds having a nitrogen atom include diethylene triamine pentaacetic acid (DTPA).

One kind of carboxylic acid compound may be used singly, or two or more kinds of carboxylic acid compounds may be used.

In a case where the chemical solution according to the embodiment of the present invention contains a carboxylic acid compound, in view of preventing the corrosion of a transition metal-containing substance (for example, copper) to be treated or improving flatness, the content of the carboxylic acid compound with respect to the total mass of the chemical solution is preferably 0.001% to 10% by mass, more preferably 0.01% to 5% by mass, and even more preferably 0.01% to 3% by mass.

(Other Chelating Agents)

The chemical solution according to the embodiment of the present invention may include a chelating agent other than the carboxylic acid compound.

(Water-Soluble Organic Solvent)

It is also preferable that the chemical solution according to the embodiment of the present invention includes a water-soluble organic solvent.

The water-soluble organic solvent is preferable in view of preventing the corrosion of a transition metal-containing substance (for example, copper) to be treated or improving flatness.

Examples of the water-soluble organic solvent include alcohol-based solvents such as methyl alcohol, ethyl alcohol, 1-propyl alcohol, 2-propyl alcohol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol; ether-based solvents such as ethylene glycol monomethyl ether, diethylene glycol, dipropylene glycol, propylene glycol monomethyl ether, diethylene glycol Monomethyl ether, triethylene glycol, polyethylene glycol, propylene glycol monomethyl ether, dipropylene glycol monomethyl ether, tripropylene glycol monomethyl ether, diethylene glycol monobutyl ether, diethylene glycol diethyl ether (DEGDEE), and diethylene glycol monobutyl ether; amide-based solvents such as formamide, monomethylformamide, dimethylformamide, acetamide, monomethylacetamide, dimethylacetamide, monoethylacetamide, diethyl acetamide, and N-methylpyrrolidone; sulfur-containing solvents such as dimethyl sulfone, dimethyl sulfoxide, and sulfolane; lactone-based solvents such as γ-butyrolactone and δ-valerolactone, and the like.

As the water-soluble organic solvent, among these, the alcohol-based solvents or the ether-based solvents are preferable, and diethylene glycol diethyl ether, 1,6-hexanediol, diethylene glycol, propylene glycol, dipropylene glycol, propylene glycol monomethyl ether, or dipropylene glycol monomethyl ether is more preferable.

One kind of water-soluble organic solvent may be used singly, or two or more kinds of water-soluble organic solvents may be used.

In a case where the chemical solution includes a water-soluble organic solvent, the content of the water-soluble organic solvent with respect to the total mass of the chemical solution is preferably greater than 0% by mass and equal to or smaller than 90% by mass, more preferably greater than 0% by mass and equal to or smaller than 40% by mass, and even more preferably 0.01% to 15% by mass.

(Other Components)

The chemical solution according to the embodiment of the present invention may include other components in addition to the components described above.

Those other components are not particularly limited, and examples thereof include known components. Examples of the components include the surfactants described in paragraph "0026" of JP2014-093407A, paragraphs "0024" to "0027" of JP2013-055087A, paragraphs "0024" to "0027" of JP2013-012614A, and the like.

Examples thereof also include the additives (anticorrosive and the like) described in paragraphs "0017" to "0038" of JP2014-107434A, paragraphs "0033" to "0047" of JP2014-103179A, paragraphs "0017" to "0049" of JP2014-093407A, and the like.

<pH>

The pH of the chemical solution according to the embodiment of the present invention is not particularly limited. Particularly, the pH of the chemical solution is preferably 3.0 to 10.0.

Particularly, in view of further improving the etching performance for a transition metal-containing substance, the pH of the chemical solution is more preferably 4.0 to 9.0.

Furthermore, in a case where two or more kinds of transition metal-containing substances need to be removed using the chemical solution or the like, in view of further improving the balance between the etching performance and the surface properties (smoothness and the like) of a portion to be treated, the pH of the chemical solution is more preferably 7.5 to 10.0.

That is, in a case where the chemical solution includes a pH adjuster, the content of the pH adjuster with respect to the total mass of the chemical solution is preferably set such that the pH of the chemical solution falls into the above range.

In the present specification, the pH of the chemical solution is a value measured at room temperature (25° C.) by using F-51 (trade name) manufactured by Horiba, Ltd.

[Method for Manufacturing Chemical Solution]

The chemical solution described above can be manufactured by a known method. Particularly, as an embodiment of the method for manufacturing a chemical solution, in view of making it possible to efficiently manufacture the chemical solution, for example, an embodiment is suitable in which the method has a step A of performing an ion exchange method on a substance to be purified including one or more kinds of periodic acids selected from the group consisting of a periodic acid and a salt thereof, one or more kinds of first metal components selected from the group consisting of Ti and Zr, and water.

As described above, in some cases, the first metal component is mixed into the periodic acids in the process of manufacturing the periodic acids. In these cases, the content of the first metal component can be adjusted to prepare the chemical solution. The inventors of the present invention have found that in a case where the content of the first metal component is reduced especially by an ion exchange method, it is easy to separate the first metal component from the periodic acids.

Hereinafter, the procedure of the step A will be specifically described.

<Substance to be Purified>

Hereinafter, each of the components included in the substance to be purified will be specifically described.

(Periodic Acids)

The substance to be purified includes one or more kinds of periodic acids selected from the group consisting of a periodic acid and a salt thereof. The definition of periodic acids is as described above.

The content of the periodic acids in the substance to be purified is not particularly limited. However, the content of the periodic acids with respect to the total mass of the substance to be purified is preferably 0.0001% to 50% by mass, more preferably 1% to 45% by mass, and even more preferably 4% to 40% by mass.

(First Metal Component)

The substance to be purified includes one or more kinds of first metal components selected from the group consisting of Ti and Zr. The definition of the first metal component is as described above.

The content of the first metal component in the substance to be purified is not particularly limited. In a case where the substance to be purified includes one kind of first metal component, in many cases, the content of the one kind of first metal component is greater than 100 ppm by mass with respect to the total mass of the periodic acids. The upper limit thereof is not particularly limited, but is equal to or smaller than 1% by mass in many cases.

In a case where the substance to be purified includes two kinds of first metal components, in many cases, the content of both the two kinds of first metal components is greater than 100 ppm by mass with respect to the total mass of the periodic acids. The upper limit thereof is not particularly limited, but is equal to or smaller than 1% by mass in many cases.

As described above, the first metal component may be separately added to the substance to be purified so as to prepare the substance to be purified.

(Water)

The substance to be purified includes water. The definition of water is as described above.

In view of excellent treatment efficiency, the concentration of water in the substance to be purified is preferably equal to or higher than 40% by mass and less than 100% by mass, preferably 50% to 99% by mass, and more preferably 60% to 95% by mass.

The substance to be purified may further include <Optional components> which may be included in the chemical solution, in addition to the components described above. Particularly, it is preferable to add a pH adjuster to the substance to be purified, because then the treatment efficiency can be improved. The pH of the substance to be purified is preferably 3.0 to 10.0, and more preferably 4.0 to 9.0.

In the present specification, the pH of the substance to be purified is measured based on the method for measuring the pH of the chemical solution.

<Procedure of Step A>

In the step A, the substance to be purified described above is subjected to an ion exchange method.

The ion exchange method is not particularly limited as long as the amount of the first metal component in the substance to be purified can be adjusted (reduced) by the method. In view of more easily manufacturing the chemical solution, it is preferable that the ion exchange method includes one or more kinds of methods among the following methods A1 to A3. The ion exchange method preferably includes two or more kinds of methods among the methods A1 to A3, and more preferably includes all of the methods A1 to A3. In a case where the ion exchange method includes all of the methods A1 to A3, the methods may be performed in any order without particular limitation, but it is preferable to perform the methods A1 to A3 in this order.

Method A1: a method of passing the substance to be purified through a first filled portion filled with a mixed resin including a cation exchange resin and an anion exchange resin.

Method A2: a method of passing the substance to be purified through at least one kind of filled portion among a second filled portion filled with a cation exchange resin, a third filled portion filled with an anion exchange resin, and a fourth filled portion filled with a chelating resin.

Method A3: a method of passing the substance to be purified through a membranous ion exchanger.

The procedure of the methods A1 to A3 will be specifically described later. In a case where the ion exchange resins (the cation exchange resin and the anion exchange resin), the chelating resin, and the membranous ion exchanger used in the methods are in forms other than $H^+$ or $OH^-$, it is preferable to use the resins and the ion exchanger after reproducing these in the form of $H^+$ or $OH^-$.

The space velocity (SV) of the substance to be purified in each of the methods is preferably 0.01 to 20.0 (1/h), and more preferably 0.1 to 10.0 (1/h).

The treatment temperature in each of the methods is preferably 0° C. to 60° C., and more preferably 10° C. to 50° C.

The ion exchange resins and the chelating resin are in the form of, for example, particles, fibers, and porous monoliths. It is preferable that the ion exchange resins and the chelating resin are in the form of particles or fibers.

The average particle size of the ion exchange resins and the chelating resin in the form of particles is preferably 10 μm to 2,000 μm, and more preferably 100 μm to 1,000 μm.

Regarding the particle size distribution of the ion exchange resins and the chelating resin in the form of particles, it is preferable that the abundance ratio of resin particles having a size in a range of average particle size±200 μm is equal to or higher than 90%.

The average particle size and the particle size distribution may be measured, for example, using a particle size distribution analyzer (Microtrac HRA3920, manufactured by NIKKISO CO., LTD.) and using water as a dispersion medium.

(Method A1)

The method A1 is a method of passing the substance to be purified through a first filled portion filled with a mixed resin including a cation exchange resin and an anion exchange resin.

As the cation exchange resin, known cation exchange resins can be used. The cation exchange resin may be a gel type or a macroreticular (MR) type resin. Among these, the gel-type cation exchange resin is preferable.

Specific examples of the cation exchange resin include a sulfonic acid-type cation exchange resin and a carboxylic acid-type cation exchange resin.

Examples of the cation exchange resin include AMBERLITE IR-124, AMBERLITE IR-120B, AMBERLITE IR-200CT, ORLITE DS-1, and ORLITE DS-4 (manufactured by ORGANO CORPORATION), DUOLITE C20J, DUOLITE C20LF, DUOLITE C255LFH, and DUOLITE C-433LF (manufactured by Sumika Chemtex Co., Ltd.), C100, C150, and C100×16MBH (manufactured by Purolite), DIAION SK-110, DIAION SKB, DIAION SK1BH, DIAION PK216, and DIAION PK228 (manufactured by Mitsubishi Chemical Corporation), and the like.

As the anion exchange resin, known anion exchange resins can be used. The anion exchange resin may be a gel type or an MR type. Among these, it is preferable to use the gel-type anion exchange resin.

Specific examples of the cation exchange resin include quaternary ammonium salt-type anion exchange resins.

Examples of the anion exchange resin include AMBERLITE IRA-400J, AMBERLITE IRA-410J, AMBERLITE IRA-900J, AMBERLITE IRA67, ORLITE DS-2, ORLITE DS-5, and ORLITE DS-6 (manufactured by ORGANO CORPORATION), DUOLIGHT A113LF, DUOLIGHT A116, and DUOLIGHT A-375LF (manufactured by Sumika Chemtex Co., Ltd.), A400 and A500 (manufactured by Purolite), DIAION SA12A, DIAION SA10AO, DIAION SA10AOH, and DIAION SA20A, and DIAION WA10 (manufactured by Mitsubishi Chemical Corporation), and the like.

Examples of commercial products marketed in the form of a premix of a strongly acidic cation exchange resin and a strongly alkaline anion exchange resin include DUOLITE MB5113, DUOLITE UP6000, and DUOLITE UP7000 (manufactured by Sumika Chemtex Co., Ltd.), AMBERLITE EG-4A-HG, AMBERLITE MB-1, AMBERLITE MB-2, AMBERJET ESP-2, AMBERJET ESP-1, ORLITE DS-3, ORLITE DS-7, and ORLITE DS-10 (manufactured by ORGANO CORPORATION), DIAION SMNUP, DIAION SMNUPB, DIAION SMT100L, and DIAION SMT200L (all manufactured by Mitsubishi Chemical Corporation), and the like.

In a case where a mixed resin including a cation exchange resin and an anion exchange resin is prepared, the mixing ratio of the resins represented by a volume ratio of cation exchange resin/anion exchange resin is preferably 1/4 to 4/1, and more preferably 1/3 to 3/1.

As a combination of the cation exchange resin and the anion exchange resin, for example, a combination of a gel-type sulfonic acid cation exchange resin and a gel-type quaternary ammonium salt anion exchange resin is suitable.

Generally, the first filled portion includes a container and the aforementioned mixed resin including a cation exchange resin and an anion exchange resin that fills up the container.

Examples of the container include a column, a cartridge, a filled column, and the like. However, containers other than those exemplified above may also be used, as long as the substance to be purified can pass through the containers filled with the mixed resin.

In the method A1, the substance to be purified may be passed through at least one first filled portion. Particularly, in view of more easily manufacturing the chemical solution, the substance to be purified may be passed through two or more first filled portions.

(Method A2)

The method A2 is a method of passing the substance to be purified through at least one kind of filled portion (preferably two or more kinds of filled portions) among a second filled portion filled with a cation exchange resin, a third filled portion filled with an anion exchange resin, and a fourth filled portion filled with a chelating resin.

Examples of the cation exchange resin and the anion exchange resin that can be used in the method A2 include the cation exchange resins and the anion exchange resins exemplified in the description of the method A1.

Generally, the second filled portion includes a container and the aforementioned cation exchange resin that fills up the container.

Generally, the third filled portion includes a container and the aforementioned anion exchange resin that fills up the container.

Generally, the fourth filled portion includes a container and a chelating resin filling up the container that will be described below.

The chelating resin generally refers to a resin having a coordinating group capable of forming a chelate bond with a metal ion.

For example, the chelating resin is a resin obtained by introducing a chelate forming group into a styrene-divinylbenzene copolymer or the like. The material of the chelating resin may be a gel type or an MR type. In view of treatment efficiency, the chelating resin is preferably in the form of particles or fibers.

Examples of the chelating resin include various chelating resins including an aminophosphonic acid type such as an iminodiacetic acid type, an iminopropionic acid type, and an aminomethylphosphonic acid type, a glucamine type such as a polyamine type and a N-methylglucamine type, an aminocarboxylic acid type, a dithiocarbamic acid type, a thiol type, an amidoxime type, and a pyridine type.

Specific examples thereof include an iminodiacetate type chelating resin such as MC700 manufactured by Sumika Chemtex Co., Ltd., an iminopropionic acid type chelating resin such as EPOLAS MX-8 manufactured by MIYOSHI OIL & FAT CO., LTD., an aminomethylphosphonic acid-type chelating resin such as MC960 manufactured by Sumika Chemtex Co., Ltd., a polyamine-type chelating resin such as S985 manufactured by Purolite and DIAION CR-20 manufactured by Mitsubishi Chemical Corporation, and a N-methylglucamine type chelating resin such as AMBERLITE IRA-743 manufactured by ORGANO CORPORATION.

The definitions of the containers in the second filled portion, the third filled portion, and the fourth filled portion are as described above.

In the method A2, the substance to be purified is passed through at least one kind of filled portion among the second filled portion, the third filled portion, and the fourth filled portion. It is particularly preferable that the substance to be purified is passed through two or more kinds of filled portions among the second filled portion, the third filled portion, and the fourth filled portion.

In the method A2, it is preferable that the substance to be purified is passes through at least the second filled portion.

Furthermore, in the method A2, in a case where the substance to be purified is passed through the fourth filled portion, even though the number of times that the substance to be purified is passed through the filled portions is small, the substance can be efficiently purified.

In a case where the substance to be purified is passed through two or more kinds of filled portions in the method A2, the substance to be purified may be passed through two or more kinds of filled portions in any order among the second filled portion, the third filled portion, and the fourth filled portion.

In the method A2, the substance to be purified may be passed through at least one second filled portion (preferably two or more second filled portions), at least one third filled portion (preferably two or more third filled portions), and/or at least one fourth filled portion.

For example, in view of more easily manufacturing the chemical solution, the substance to be purified may be passed through one or more (preferably two or more) second filled portions and one or more (preferably two or more) third filled portions.

In this case, there is no limitation on the order in which the substance to be purified is passed through the filled portions. For example, the substance to be purified may be alternately passed through the second filled portion and the third filled portion. Alternatively, the substance to be purified may be continuously passed through one of a plurality of second filled portions and a plurality of third filled portions, and then continuously passed through the other ones among the plurality of second filled portions or the plurality of third filled portions.

In addition, in view of more easily manufacturing the chemical solution, the substance to be purified may be passed through one or more second filled portions and one or more fourth filled portions.

Even in this case, there is no limitation on the order in which the substance to be purified is passed through the filled portions.

(Method A3)

The method A3 is a method of passing the substance to be purified through a membranous ion exchanger.

The membranous ion exchanger is a membrane having an ion exchange group. Examples of the ion exchange group include a cation exchange group (such as a sulfonic acid group) and/or an anion exchange group (such as an ammonium group).

The membranous ion exchanger may be constituted with an ion exchange resin, or may be constituted with a membranous support and a cation exchange group and/or an anion exchange group introduced into the support. The membranous ion exchanger (including the support of the membranous ion exchanger) may be porous or nonporous. The membranous ion exchanger (including the support of the membranous ion exchanger) may be obtained by forming an aggregate of particles and/or fibers into a membrane.

Furthermore, for example, the membranous ion exchanger may be any of an ion exchange membrane, ion exchange nonwoven cloth, ion exchange filter paper, and ion exchange filter cloth.

The membranous ion exchanger may be used, for example, in a manner in which the membranous ion exchanger is incorporated into a cartridge as a filter and an aqueous solution is passed through the filter.

It is preferable to use a semiconductor-grade membranous ion exchanger.

Examples of commercial products of the membranous ion exchanger include MUSTANG (manufactured by Pall Corporation) and a PROTEGO (registered trademark) Plus LT Purifier (manufactured by Entegris).

The thickness of the membranous ion exchanger is not particularly limited, and is preferably, for example, 0.01 to 1 mm.

The flow rate of the aqueous solution is, for example, 1 to 100 ml/(min·cm$^2$).

In the method A3, the substance to be purified may be passed through at least one membranous ion exchanger. Particularly, in view of more easily manufacturing the chemical solution, the substance to be purified may be passed through two or more membranous ion exchangers.

In a case where two or more membranous ion exchangers are used, at least one membranous ion exchanger having a cation exchange group and at least one ion exchanger having an anion exchange group may be used.

In view of manufacturing efficiency of the chemical solution, it is preferable that the ion exchange method is performed until the content of the first metal component included in the substance to be purified satisfies the requirement on the content (or the condition of the preferred content) of the first metal component included in the chemical solution.

Specifically, the content of the first metal component in the substance to be purified having been subjected to the ion exchange method is preferably, for example, 1 ppt by mass to 100 ppm by mass with respect to the total mass of the periodic acids.

Furthermore, in view of efficiently obtaining the chemical solution having higher etching performance, the content is preferably equal to or greater than 1 ppb by mass. Likewise, in view of efficiently obtaining the chemical solution having higher defect inhibition performance, the content is preferably equal to or smaller than 100 ppb by mass, more preferably equal to or smaller than 10 ppb by mass, and even more preferably equal to or smaller than 5 ppb by mass.

<Step B>

In view of reducing the number of particles in the obtained chemical solution, it is preferable that the method for manufacturing a chemical solution according to the embodiment of the present invention has a step B of filtering the substance to be purified having undergone the step A by using a filter after the step A.

The type of the filter is not particularly limited. Examples thereof include filters made of a fluororesin such as polytetrafluoroethylene (PTFE), a polyamide-based resin such as nylon, a polyolefin resin (including high-density polyolefin and ultra-high molecular weight polyolefin) such as polyethylene and polypropylene (PP), and the like. Among these materials, polyethylene (including high-density polyethylene (HDPE)), polypropylene (including high-density polypropylene), or nylon is preferable.

The pore size of the filter is preferably 0.001 to 1.0 µm, more preferably 0.01 to 0.5 µm, and even more preferably 0.02 to 0.1 µm. In a case where the pore size is within the above range, it is possible to inhibit the clogging of the filter and to control the number of minute foreign substances such as impurities and aggregates included in the substance to be purified.

At the time of using the filter, different filters may be combined. At this time, filtering carried out using a first filter may be performed once or performed two or more times. In a case where filtering is performed two or more times by using different filters in combination, the pore size for the second filtering and the next filtering may be the same as or larger than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like.

As a second filter, a filter formed of the same material as the aforementioned first filter and the like can be used.

<Step C>

The method for manufacturing a chemical solution according to the embodiment of the present invention may have a step C of mixing the substance to be purified with a pH adjuster before the step A. In a case where the step C is performed, it is possible to adjust the pH of the substance to be purified subjected to the step A and to further increase the efficiency of the ion exchange method performed in the step A.

Examples of the pH adjuster used in the Step C include the pH adjusters described above.

As a procedure of the step C, for example, a method of mixing the substance to be purified with a pH adjuster may be adopted.

The pH of the substance to be purified having undergone the step C is adjusted to an optimal range according to the ion exchange method performed in the step A, but is preferably 3.0 to 10.0 and more preferably 4.0 to 9.0.

Hitherto, the method for manufacturing a chemical solution by using an ion exchange method has been described, but the method for manufacturing a chemical solution according to the embodiment of the present invention is not limited to the above method.

For example, the chemical solution may be manufactured by mixing together periodic acids, the first metal component, and water. For instance, in a case where the first metal component is Ti ions, an aqueous solution including periodic acids and water may be brought into contact with Ti metal such that Ti ions are eluted in the aqueous solution.

<Use>

The chemical solution according to the embodiment of the present invention can be used for various purposes. Particularly, the chemical solution can be suitably used for treating a substrate having a transition metal-containing substance.

Hereinafter, the use of the chemical solution for removing a transition metal-containing substance on a substrate will be specifically described.

<Step D>

As described above, the chemical solution according to the embodiment of the present invention is suitably used for removing a transition metal-containing substance on a substrate. In other words, the present invention also relates to a method for treating a substrate, including a step D of removing a transition metal-containing substance on a substrate by using the chemical solution.

In the present specification, "on a substrate" includes, for example, all of the front and back, the lateral surfaces, and the inside of grooves of a substrate, and the like. The transition metal-containing substance on a substrate includes not only a transition metal-containing substance which directly contacts the surface of the substrate but also a transition metal-containing substance which is on the substrate through another layer.

Examples of the transition metal included in the transition metal-containing substance include a metal M selected from Ru (ruthenium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

That is, as the transition metal-containing substance, a substance including the metal M is preferable.

Particularly, the transition metal-containing substance is preferably a Ru-containing substance. That is, the chemical solution according to the embodiment of the present invention is more preferably used for removing the Ru-containing substance.

The content of Ru atoms in the Ru-containing substance with respect to the total mass of the Ru-containing substance is preferably equal to or greater than 30% by mass, more preferably equal to or greater than 50% by mass, and even more preferably equal to or greater than 90% by mass.

The transition metal-containing substance is also preferably a Cu-containing substance. That is, the chemical solution according to the embodiment of the present invention is also preferably used for removing the Cu-containing substance.

The content of Cu atoms in the Cu-containing substance with respect to the total mass of the Cu-containing substance is preferably equal to or greater than 30% by mass, more preferably equal to or greater than 50% by mass, and even more preferably equal to or greater than 90% by mass.

The transition metal-containing substance only needs to be a substance including a transition metal (transition metal atoms), and examples thereof include a simple transition metal, an alloy including a transition metal, an oxide of a transition metal, a nitride of a transition metal, and an oxynitride of a transition metal. Among these, as the transition metal-containing substance, simple Ru, an alloy of Ru, an oxide of Ru, a nitride of Ru, or an oxynitride of Ru is preferable. As the transition metal-containing substance, simple Cu, an alloy of Cu, an oxide of Cu, a nitride of Cu, or an oxynitride of Cu is preferable.

Furthermore, the transition metal-containing substance may be a mixture including two or more kinds of compounds among the above compounds.

The oxide, nitride, and oxynitride described above may be a composite oxide, a composite nitride, and a composite oxynitride including a transition metal.

The content of transition metal atoms in the transition metal-containing substance with respect to the total mass of the transition metal-containing substance is preferably equal to or greater than 30% by mass, more preferably equal to or greater than 50% by mass, and even more preferably equal to or greater than 90% by mass. The upper limit thereof is 100% by mass because the transition metal-containing substance may be a transition metal.

The object to be treated is a substrate having a transition metal-containing substance. That is, the object to be treated includes at least a substrate and a transition metal-containing substance on the substrate.

The type of the substrate is not particularly limited, but is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The type of the transition metal-containing substance on the substrate is as described above.

The form of the transition metal-containing substance on the substrate is not particularly limited. For example, the transition metal-containing substance may be disposed in the form of a film (transition metal-containing film), in the form of wiring (transition metal-containing wiring), or in the form of particles. As described above, the transition metal is preferably Ru, and the object to be treated preferably has a substrate and a Ru-containing film, Ru-containing wiring, or a particle-like Ru-containing substance which is disposed on the substrate. As the transition metal, Cu is also preferable, and the object to be treated also preferably has a substrate and a Cu-containing film, Cu-containing wiring, or a particle-like Cu-containing substance which is disposed on the substrate.

It is also preferable that two or more kinds of transition metal-containing substances are present on the substrate. For example, a Ru-containing substance (such as a Ru-containing film, Ru-containing wiring, and/or a particle-like Ru-containing substance) and a Cu-containing substance (such as a Cu-containing film, Cu-containing wiring, and/or a particle-like Cu-containing substance) may be present on the substrate at the same time. In a case where two or more kinds of transition metal-containing substances are present on the substrate at the same time, the two or more kinds of transition metal-containing substances may be present separately or present in the form of a uniform mixture.

Examples of the substrate, on which the transition metal-containing substance is disposed in the form of particles, include a substrate obtained by performing dry etching on a substrate having a transition metal-containing film such that particle-like transition metal-containing substances are then attached to the substrate as residues as will be described later, and a substrate obtained by performing CMP on the transition metal-containing film such that particle-like transition metal-containing substances are then attached to the substrate as residues as will be described later.

The thickness of the transition metal-containing film is not particularly limited, and may be appropriately selected according to the use. For example, the thickness is preferably equal to or smaller than 50 nm, more preferably equal to or smaller than 20 nm, and even more preferably equal to or smaller than 10 nm.

The transition metal-containing film may be disposed only on one of the main surfaces of the substrate, or may be disposed on both the main surfaces of the substrate. Furthermore, the transition metal-containing film may be disposed on the entire main surface of the substrate, or may be disposed on a portion of the main surface of the substrate.

The substrate may have various layers and/or structures as desired in addition to the transition metal-containing substance. For example, the substrate may have metal wiring, a gate electrode, a source electrode, a drain electrode, an insulating layer, a ferromagnetic layer, and/or a non-magnetic layer, and the like.

The substrate may have the structure of an exposed integrated circuit, for example, an interconnection mechanism such as metal wiring and a dielectric material. Examples of metals and alloys used for the interconnect mechanism include aluminum, a copper-aluminum alloy, copper, titanium, tantalum, cobalt, silicon, titanium nitride, tantalum nitride, and tungsten. The substrate may have a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to the embodiment of the present invention has a transition metal-containing substance on a substrate.

The method for manufacturing the substrate having the transition metal-containing substance is not particularly limited. For example, a transition metal-containing film can be formed on a substrate by a sputtering method, a chemical vapor deposition (CVD) method, a molecular beam epitaxy (MBE) method, or the like. In a case where the transition metal-containing film is formed by a sputtering method, a CVD method, or the like, sometimes the transition metal-containing substance is also attached to the back surface of the substrate having the transition metal-containing film (the surface opposite to the side of the transition metal-containing film).

Furthermore, transition metal-containing wiring may be formed on a substrate by performing the aforementioned method through a predetermined mask.

In addition, after the transition metal-containing film or the transition metal-containing wiring is formed on a substrate, the substrate may be further subjected to a different process or treatment and then used as the object to be treated by the treatment method of the present invention.

For example, by performing dry etching on a substrate having a transition metal-containing film or transition metal-containing wiring, a substrate having dry etching residues including a transition metal may be manufactured. Furthermore, by performing CMP on a substrate having a transition metal-containing film or transition metal-containing wiring, a substrate having a transition metal-containing substance may be manufactured.

Examples of the specific method of the step D include a method of bringing the substrate having a transition metal-containing substance, which is an object to be treated, into contact with the chemical solution.

The method of bringing the substrate into contact with the chemical solution is not particularly limited, and examples thereof include a method of immersing the object to be treated in the chemical solution put in a tank, a method of spraying the chemical solution onto the substrate, a method of causing the chemical solution to flow on the substrate, and any combination of these. Among these, the method of immersing the substrate having a transition metal-containing substance, which is an object to be treated, in the chemical solution is preferable.

The treatment time of the step D can be adjusted according to the method of bringing the chemical solution into contact with the substrate, the temperature of the chemical solution, and the like. The treatment time (the contact time between the chemical solution and the object to be treated) is not particularly limited, but is preferably 0.01 to 30 minutes, and more preferably 0.1 to 5 minutes.

The temperature of the chemical solution during the treatment is not particularly limited, but is preferably 20° C. to 75° C., more preferably 30° C. to 65° C., and even more preferably 40° C. to 65° C. The temperature is still more preferably 50° C. to 65° C.

In the step D, only one kind of transition metal-containing substance or two or more kinds of transition metal-containing substances may be removed from the substrate.

In a case where two or more kinds of transition metal-containing substances are removed by the step D, the two or more kinds of transition metal-containing substances may be removed simultaneously by a single treatment or may be separately treated.

Examples of the combination of two or more kinds of transition metal-containing substances include a combination of substances including two or more kinds of metals among the metals M described above (two or more kinds of metal M-containing substances). Among these, a combination including at least a Ru-containing substance and a Cu-containing substance is preferable.

Specifically, examples of suitable embodiments of the step D include a step D1 of performing a recess etching treatment on transition metal-containing wiring disposed on a substrate by using the chemical solution, a step D2 of removing a transition metal-containing film on outer edge portions of a substrate, on which the transition metal-containing film is disposed, by using the chemical solution, a step D3 of removing a transition metal-containing substance attached to a back surface of a substrate, on which a transition metal-containing film is disposed, by using the chemical solution, a step D4 of removing a transition metal-containing substance on a substrate, which has undergone dry etching, by using the chemical solution, and a step D5 of removing a transition metal-containing substance on a substrate, which has undergone a chemical mechanical polishing treatment, by using the chemical solution.

Among these, as the step D, the step D1, the step D2, or the step D3 is preferable, and the step D2 or the step D3 is more preferable.

Hereinafter, the steps D1 to D3 will be specifically described.

Step D1

Examples of the step D include a step D1 of performing a recess etching treatment on transition metal-containing wiring disposed on a substrate by using the chemical solution.

FIG. 1 is a schematic cross-sectional top view showing an example of a substrate having transition metal-containing wiring (hereinafter, referred to as "wiring substrate" as well) which is an object to be treated by the recess etching treatment in the step D1.

A wiring substrate 10a shown in FIG. 1 has a substrate not shown in the drawing, an insulating film 12 (interlayer insulating film 12) having a groove disposed on the substrate, a barrier metal layer 14 disposed along the inner wall of the groove, and transition metal-containing wiring 16 that fills up the inside of the groove.

The substrate and the transition metal-containing wiring in the wiring substrate are as described above.

As the transition metal-containing wiring, Ru-containing wiring (wiring including Ru) is preferable. It is preferable that the Ru-containing wiring includes simple Ru, an alloy of Ru, an oxide of Ru, a nitride of Ru, or an oxynitride of Ru.

As the transition metal-containing wiring, Cu-containing wiring (wiring including Cu) is also preferable. It is preferable that the Cu-containing wiring includes simple Cu, an alloy of Cu, an oxide of Cu, a nitride of Cu, or an oxynitride of Cu.

The material constituting the barrier metal layer in the wiring substrate is not particularly limited, and examples thereof include TiN and TaN.

In FIG. 1, an embodiment is illustrated in which the wiring substrate has a barrier metal layer. However, the wiring substrate may not have the barrier metal layer.

A liner layer may be disposed between the barrier metal layer 14 and the transition metal-containing wiring 16, although the liner layer is not shown in FIG. 1. The material constituting the liner layer is not particularly limited, and examples thereof include a Ru-containing substance and a Cu-containing substance.

The method for manufacturing the wiring substrate is not particularly limited, and examples thereof include a method including a step of forming an insulating film on a substrate, a step of forming a groove in the insulating film, a step of forming a barrier metal layer on the insulating film, a step of forming a transition metal-containing film that fills up the groove, and a step of performing a smoothing treatment on the transition metal-containing film.

The method for manufacturing the wiring substrate may include a step of forming a liner layer on the barrier metal layer between the step of forming a barrier metal layer on the insulating film and the step of forming a transition metal-containing film for filling up the groove.

In the step D1, by performing a recess etching treatment on the transition metal-containing wiring in the wiring substrate by using the aforementioned chemical solution, a portion of the transition metal-containing wiring can be removed, and a recess portion can be formed.

Figure 2:
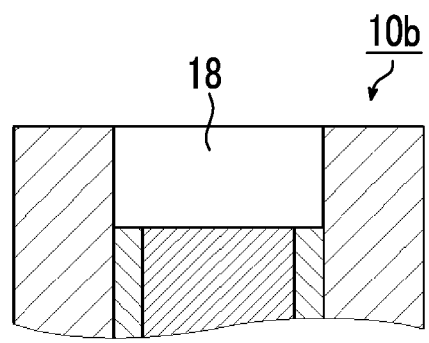
FIG. 2 is a schematic cross-sectional top view showing an example of an object to be treated having undergone the step D1.

More specifically, in a case where the step D1 is performed, as shown in the wiring substrate 10b in FIG. 2, a portion of the barrier metal layer 14 and the transition metal-containing wiring 16 is removed, and a recess portion 18 is formed.

Examples of the specific method of the step D1 include a method of bringing the wiring substrate into contact with the chemical solution.

The method of bringing the wiring substrate into contact with the chemical solution is as described above.

The suitable ranges of the contact time between the chemical solution and the wiring substrate and the temperature of the chemical solution are as described above.

After the step D1, if necessary, a step Db of treating the substrate obtained by the step D1 by using a predetermined solution (hereinafter, referred to as "specific solution" as well) may be performed.

Particularly, as described above, in a case where the barrier metal layer is disposed on the substrate, the solubility in the chemical solution according to the embodiment of the present invention varies between the component constituting the transition metal-containing wiring and the component constituting the barrier metal layer depending on the type of the components. In this case, it is preferable to adjust the degree of solubility of the transition metal-containing wiring and the barrier metal layer by using a solution that dissolves better the barrier metal layer.

In this respect, as the specific solution, a solution is preferable which poorly dissolves the transition metal-containing wiring but excellently dissolves the substance constituting the barrier metal layer.

Examples of the specific solution include a solution selected from the group consisting of a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), and a mixed solution of hydrochloric acid and aqueous hydrogen peroxide (HPM).

The composition of FPM is, for example, preferably in a range of "hydrofluoric acid:aqueous hydrogen peroxide:water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3:1:0" to "sulfuric acid:aqueous hydrogen peroxide:water=1:1:10" (volume ratio).

The composition of APM is, for example, preferably in a range of "aqueous ammonia:aqueous hydrogen peroxide:water=1:1:1" to "aqueous ammonia:aqueous hydrogen peroxide:water=1:1:30" (volume ratio).

The composition of HPM is, for example, preferably in a range of "hydrochloric acid:aqueous hydrogen peroxide:water=1:1:1" to "hydrochloric acid:aqueous hydrogen peroxide:water=1:1:30" (volume ratio).

The preferred compositional ratio described above means a compositional ratio determined in a case where the content of hydrofluoric acid is 49% by mass, the content of sulfuric acid is 98% by mass, the content of aqueous ammonia is 28% by mass, the content of hydrochloric acid is 37% by mass, and the content of aqueous hydrogen peroxide is 31% by mass.

Among these, in view of dissolving ability for the barrier metal layer, SPM, APM, or HPM is preferable.

In view of reducing roughness, APM, HPM, or FPM is preferable, and APM is more preferable.

In view of achieving excellent balance between performances, APM or HPM is preferable.

In the step Db, as the method of treating the substrate obtained by the step D1 by using the specific solution, a method of bringing the substrate obtained by the step D1 into contact with the specific solution is preferable.

The method of bringing the substrate obtained by the step D1 into contact with the specific solution is not particularly limited, and examples thereof include the same method as the method of bringing the substrate into contact with the chemical solution.

The contact time between the specific solution and the substrate obtained by the step D1 is, for example, preferably 0.25 to 10 minutes, and more preferably 0.5 to 5 minutes.

In the present treatment method, the step D1 and the step Db may be performed alternately.

In a case where the steps are performed alternately, it is preferable that each of the step D1 and the step Db is performed 1 to 10 times.

The step D1 is also preferably a step D1X of simultaneously removing two or more transition metal-containing substances (for example, two or more kinds of metal M-containing substances and preferably a combination of a Ru-containing substance and a Cu-containing substance).

The step D1X is performed, for example, on a wiring substrate which contains at least transition metal-containing wiring and a liner layer, in which the transition metal-containing wiring and the liner layer are different transition metal-containing substances.

In this case, for example, the wiring substrate is preferably a substrate in which the transition metal-containing wiring is Cu-containing wiring and the liner layer is a Ru-containing substance or a substrate in which the transition metal-containing wiring is Ru-containing wiring and the liner layer is a Cu-containing substance, and more preferably a substrate in which the transition metal-containing wiring is Cu-containing wiring and the liner layer is a Ru-containing substance.

In a case where the step D1X is performed (preferably in a case where a Cu-containing substance is included in two or more kinds of transition metal-containing substances and more preferably in a case where a Ru-containing substance and a Cu-containing substance are included in two or more kinds of transition metal-containing substances), in view of further improving the balance between the etching rate and the surface condition (smoothness and the like) of the portion to be treated, the pH of the chemical solution is preferably 3.0 to 10.0, more preferably 7.5 to 10.0, and even more preferably 8.0 to 10.0.

It is considered that in a case where the pH of the chemical solution is 7.5 to 10.0 (preferably 8.0 to 10.0), the chemical solution may etch the transition metal-containing substance while forming a layer on the surface of the treated transition metal-containing substance (particularly the Cu-containing substance). Presumably, as a result, the surface properties of the transition metal-containing wiring and the like may be excellent after the treatment (for example, the surface is not oxidized and has excellent smoothness).

Even in a case where the step D1 is the step D1X, the step Db may be performed after the step D1X or alternately with the step D1X.

Step D2

Examples of the step D include a step D2 of removing a transition metal-containing film at the outer edge portion of a substrate, on which the transition metal-containing film is disposed, by using the chemical solution.

Figure 3:
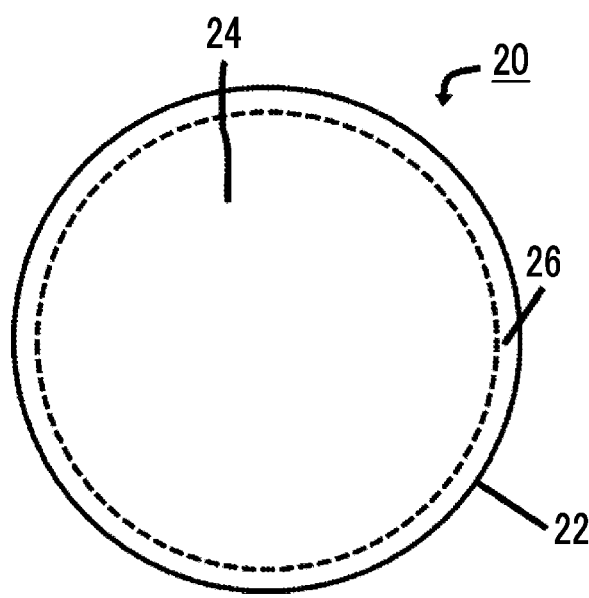
FIG. 3 is a schematic view showing an example of an object to be treated used in a step D2.

FIG. 3 is a schematic view (top view) showing an example of a substrate, on which a transition metal-containing film is disposed, as an object to be treated by the step D2.

An object 20 to be treated by the step D2 shown in FIG. 3 is a laminate having a substrate 22 and a transition metal-containing film 24 disposed on one main surface (entire region surrounded by the solid line) of the substrate 22. As will be described later, in step D2, the transition metal-containing film 24 positioned at an outer edge portion 26 (the region outside the broken line) of the object 20 to be treated is removed.

The substrate and the transition metal-containing film in the object to be treated are as described above.

As the transition metal-containing film, a Ru-containing film (film including Ru) is preferable. It is preferable that the Ru-containing film includes simple Ru, an alloy of Ru, an oxide of Ru, a nitride of Ru, or an oxynitride of Ru.

The specific method of the step D2 is not particularly limited, and examples thereof include a method of supplying the chemical solution from a nozzle such that the chemical solution contacts only the transition metal-containing film at the outer edge portion of the substrate.

At the time of performing the treatment of the step D2, it is possible to preferably use the substrate treatment device and the substrate treatment method described in JP-2010-267690A, JP2008-080288A, JP2006-100368A, and JP2002-299305A.

The method of bringing the object to be treated into contact with the chemical solution is as described above.

The suitable ranges of the contact time between the chemical solution and the object to be treated and the temperature of the chemical solution are as described above.

Step D3

Examples of the step D include a step D3 of removing a transition metal-containing substance attached to the back surface of a substrate, on which a transition metal-containing film is disposed, by using the chemical solution.

Examples of the object to be treated by the step D3 include the object to be treated used in the step D2. At the time of forming the object to be treated, which is constituted with a substrate and a transition metal-containing film disposed on one main surface of the substrate, used in the step D2, the transition metal-containing film is formed by sputtering, CVD, or the like. At this time, sometimes a transition metal-containing substance is attached to a surface (back surface) of the substrate that is opposite to the transition metal-containing film. The step D3 is performed to remove such a transition metal-containing substance in the object to be treated.

The specific method of the step D3 is not particularly limited, and examples thereof include a method of spraying the chemical solution such that the chemical solution contacts only the back surface of the substrate.

The method of bringing the object to be treated into contact with the chemical solution is as described above.

The suitable ranges of the contact time between the chemical solution and the object to be treated and the temperature of the chemical solution are as described above.

It is also preferable to perform a rinsing treatment after bringing the chemical solution into contact with the object to be treated.

In a case where the object to be treated is brought into contact with the chemical solution according to the embodiment of the present invention, sometimes an iodine compound derived from the chemical solution according to the embodiment of the present invention is attached to the surface of the object to be treated as residual iodine (I residue).

Such residual iodine (I residue) may negatively affect the subsequent processes and/or end products. By performing the rinsing treatment, it is possible to remove the residual iodine (I residue) from the surface of the object to be treated.

Furthermore, by the rinsing treatment, it is also possible to remove the residues of the removed transition metal-containing substance that occur on the surface of the object to be treated by the step D1.

The rinsing treatment is preferably performed by a method of bringing a rinsing solution into contact with the object to be treated.

The method of bringing the substrate into contact with the rinsing solution is performed, for example, by immersing the object to be treated in the rinsing solution put in a tank, spraying the rinsing solution to the surface of the object to be treated, causing the rinsing solution to flow on the surface of the object to be treated, or any combination of these.

As the rinsing solution, for example, hydrofluoric acid, hydrochloric acid, aqueous hydrogen peroxide, a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), a mixed solution of hydrochloric acid and aqueous hydrogen peroxide (HPM), aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, acetic acid (including an aqueous acetic acid solution), or an aqueous orthoperiodic acid solution is preferable.

As the rinsing solution, an acidic rinsing solution is preferable, because this solution can efficiently remove the residues of the removed transition metal-containing substance that occur on the surface of the object to be treated by the step D1 (particularly the step D1X), and improves the surface properties of the substrate after the treatment (particularly, the surface properties of the transition metal-containing wiring and the like after the treatment).

Examples of the acidic rinsing solution include an aqueous citric acid solution (preferably a 0.01% to 10% by mass aqueous citric acid solution), hydrofluoric acid (preferably 0.001% to 1% by mass hydrofluoric acid), hydrochloric acid (preferably 0.001% to 10% by mass hydrochloric acid), aqueous hydrogen peroxide (preferably 0.5% to 31% by mass aqueous hydrogen peroxide, and more preferably 3% to 15% by mass aqueous hydrogen peroxide), a mixed solution of hydrofluoric acid and aqueous hydrogen peroxide (FPM), a mixed solution of sulfuric acid and aqueous hydrogen peroxide (SPM), a mixed solution of hydrochloric acid and aqueous hydrogen peroxide (HPM), carbon dioxide (preferably 10 to 60 ppm by mass carbon dioxide), aqueous ozone (preferably 10 to 60 ppm by mass aqueous ozone), aqueous hydrogen (preferably 10 to 20 ppm by mass aqueous hydrogen), sulfuric acid (preferably 1% to 10% by mass aqueous sulfuric acid solution), and an aqueous hypochlorous acid solution (preferably a 1% to 10% by mass aqueous hypochlorous acid solution), aqua regia (preferably aqua regia obtained by mixing together 37% by mass hydrochloric acid:60% by mass nitric acid at a volume ratio of 2.6:1.4 to 3.4:0.6), nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), acetic acid (preferably a 0.01% to 10% by mass aqueous acetic acid solution or an undiluted acetic acid solution), and an aqueous periodic acid solution (preferably a 0.5% to 10% by mass aqueous periodic acid solution). As the periodic acid, for example, orthoperiodic acid and metaperiodic acid are preferable. Among these, an aqueous citric acid solution is more preferable.

Preferred conditions for FPM, SPM, APM, and HPM are, for example, the same as the preferred conditions for FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The aqueous ozone, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing solutions may be used by being mixed together.

The treatment time (contact time between the rinsing solution and the object to be treated) of the rinsing treatment is not particularly limited, but is 5 seconds to 5 minutes for example.

The temperature of the rinsing solution during the treatment is not particularly limited. Generally, for example, the temperature of the rinsing solution is preferably 16° C. to 60° C., and more preferably 18° C. to 40° C. In a case where SPM is used as the rinsing solution, the temperature is preferably 90° C. to 250° C.

Furthermore, the rinsing solution may include an organic solvent.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

Example X

An aqueous solution (substance to be purified) including a periodic acid and the like was treated by an ion exchange method which will be described later.

The raw materials used for preparing the aqueous solution are as follows.

Water: ultrapure water (ultrapure water manufactured by an ultrapure water manufacturing device "PURELAB Ultra" (manufactured by ORGANO CORPORATION))

Orthoperiodic acid: reagent A (orthoperiodic acid including Ti and Zr)

(pH Adjuster)

TMAH: Tetramethylammonium hydroxide
TEAH: Tetraethylammonium hydroxide
TBAH: Tetrabutylammonium hydroxide
DBU: diazabicycloundecene All the pH adjusters used were classified as a semiconductor grade.

<Ion Exchange Resin or Membranous Ion Exchanger>

The ion exchange resins and membranous ion exchangers used in the methods A1 to A3, which will be described later, are as follows.

(Mixed Resin (Used in Method A1))

DS-3: ORLITE DS-3 (manufactured by ORGANO CORPORATION)
DS-7: ORLITE DS-7 (manufactured by ORGANO CORPORATION)
DS-10: ORLITE DS-10 (manufactured by ORGANO CORPORATION)

SMNUPB: DIAION SMNUPB (manufactured by Mitsubishi Chemical Corporation.)
SMT100L: DIAION SMT100L (manufactured by Mitsubishi Chemical Corporation.)
SMT200L: DIAION SMT200L (manufactured by Mitsubishi Chemical Corporation.)

(Cation Exchange Resin, Anion Exchange Resin, and Chelating Resin (Used in Method A2))

DS-1: ORLITE DS-1 (manufactured by ORGANO CORPORATION)
DS-4: ORLITE DS-4 (manufactured by ORGANO CORPORATION)
200CT: AMBERLITE 200CT (manufactured by ORGANO CORPORATION (semiconductor grade))
SK1BH: DIAION SK1BH (manufactured by Mitsubishi Chemical Corporation.)
PK216: DIAION PK216 (manufactured by Mitsubishi Chemical Corporation.)
PK228: DIAION PK228 (manufactured by Mitsubishi Chemical Corporation.)
RCP160M: DIAION RCP160M (manufactured by Mitsubishi Chemical Corporation.)
C100: PUROLITE C100 (manufactured by Purolite)
C150: PUROLITE C150 (manufactured by Purolite)
C100x16MBH: PUROLITE C100x16MBH (manufactured by Purolite)
C255LFH: DUOLITE C255LFH (manufactured by Sumika Chemtex Co., Ltd.)
C20J: DUOLIGHT C20J (manufactured by Sumika Chemtex Co., Ltd.)
DS-2: ORLITE DS-2 (manufactured by ORGANO CORPORATION)
DS-5: ORLITE DS-5 (manufactured by ORGANO CORPORATION)
DS-6: ORLITE DS-6 (manufactured by ORGANO CORPORATION)
IRA900J: AMBERLITE IRA900J (manufactured by ORGANO CORPORATION) (non-semiconductor-grade))
SA10AOH: DIAION SA10AOH (manufactured by Mitsubishi Chemical Corporation.)
A500: PUROLITE A500 (manufactured by Purolite)
A113LF: DUOLIGHT A113LF (manufactured by Sumika Chemtex Co., Ltd.)
A116: DUOLIGHT A116 (manufactured by Sumika Chemtex Co., Ltd.)
S985: PUROLITE S985 (manufactured by Purolite)
MC700: SUMICHELATE MC700 (manufactured by Sumika Chemtex Co., Ltd.)
MC960: SUMICHELATE MC960 (manufactured by Sumika Chemtex Co., Ltd.)

(Membranous Ion Exchanger (Used in Method A3))
Mustang: MUSTANG Q (manufactured by Pall Corporation)
Purifier: PROTEGO® Plus LT Purifier (manufactured by Entegris.)

<Treatment Method>
(Preparation of Aqueous Solution (Substance to be Purified))

The aforementioned orthoperiodic acid and a pH adjuster, which was used if necessary, were dissolved in water, thereby preparing aqueous solutions having the formulation described in the following Table 1.

(Ion Exchange Method)

By using the ion exchange resin or the membranous ion exchanger described in Table 1, one or more ion exchange methods selected from the group consisting of the method A1, the method A2, and the method A3, which will be described later, were performed, thereby treating the each of the aqueous solutions (500 g).

In a case where two or more steps were performed, the same aqueous solution was sequentially treated by the method A1, the method A2, and the method A3 in this order. In the following Table 1, a blank means that the aqueous solution was not treated by the corresponding method.

Method A1

A vertically set column (inner volume: 300 ml) was filled with the first mixed resin (150 ml) shown in the field of "1" of the field of "Mixed resin" in the following Table 1. An aqueous solution was passed through this column at a space velocity (SV) of 1.4 (1/h).

In the examples described in the field of "2" of the field of "Mixed resin" and the field of "3" of the field of "Mixed resin" in Table 1, each column was filled with the mixed resin (150 ml) described in each field, and the aqueous solution was passed through the column. In a case where the aqueous solution was passed through a plurality of columns, the aqueous solution was passed through the columns in the fields of "1", "2", and "3" in this order.

In a series of operations, all of the mixed resin, the aqueous solution, and the like were kept at a temperature of 10° C.

Method A2

A vertically set column (inner volume: 300 ml) was filled with a first cation exchange resin (75 ml) described in the field of "1" of the field of "Acidic cation exchange resin" shown in the following table. This is called first cation exchange column.

Likewise, a vertically set column (inner volume: 300 ml) was filled with a first anion exchange resin (75 ml) described in the field of "1" of the field of "Basic anion exchange resin" shown in the following table. This is called first anion exchange column.

Similarly, a vertically set column (inner volume: 300 ml) was filled with a first chelating resin (75 ml) described in the field of "1" of the field of "Chelating resin" shown in the following table. This is called first chelating resin column.

The aqueous solution was passed through the first cation exchange column and then, as desired, through the first anion exchange column or the first chelating resin column.

In addition, in a case where a second acidic cation exchange resin described in the field of "2" of the field of "Acidic cation exchange resin" and a second basic anion exchange resin described in the field of "2" of the field of "Basic anion exchange resin" were used, the aqueous solution was further passed through the second cation exchange column (prepared in the same manner as the first cation exchange column) and then passed through the second anion exchange column (prepared in the same manner as the first anion exchange column).

The aqueous solution was passed through the columns at a space velocity (SV) of 1.4 (1/h) all the time. In a series of operations, all of the cation exchange resin, the anion exchange resin, the chelating resin, the aqueous solution, and the like were kept at a temperature of 10° C.

The cation exchange resin and the anion exchange resin, which were in forms other than $H^+$ or the $OH^-$, were used for the test after being reproduced as resins in the form of $H^+$ or the $OH^-$.

Method A3

The aqueous solution was passed through the first ion-exchange resin membrane (0.02 cm$^2$) shown in the field of "1" of the field of "Ion exchange membrane" in the following table at 100 ml/min.

In a case where the second membranous ion exchanger shown in the field of "2" of the field of "Ion-exchange membrane" was used, the aqueous solution having been passed through the first ion-exchange membrane was also passed through the second membranous ion exchanger.

In a series of operations, all of the membranous ion exchanger, the aqueous solution, and the like were kept at a temperature of 10° C.

(Step B)

In some examples and comparative examples, the aqueous solution having been subjected to the ion exchange method was further subjected to the step B of filtering the solution by using a filter. As the filter, a high-density polyethylene (HDPE) filter having a pore size of 10 nm was used.

In Comparative Example A1, a step of filtering the aqueous solution by using a filter was performed without performing the ion exchange method.

[Evaluation]

The content of Ti and Zr included in the treated aqueous solution in each of the examples and comparative examples was measured using Agilent 8800 triple quadrupole inductively coupled plasma mass spectrometry (ICP-MS, for semiconductor analysis, option #200).

(Measurement Condition)

As a sample introduction system, a quartz torch, a coaxial perfluoroalkoxyalkane (PFA) nebulizer (for self-suction), and a platinum interface cone were used. The measurement parameters of cool plasma conditions are as follows.

Output of Radio Frequency (RF) (W): 600
Flow rate of carrier gas (L/min): 0.7
Flow rate of makeup gas (L/min): 1
Sampling depth (mm): 18

In measuring the content of Ti and Zr, the aqueous solution for which the content of Ti and Zr is to be determined was generally adopted as a measurement target. In a case where the aqueous solution was adopted as a measurement target, and the content of Ti and Zr in the aqueous solution was less than the detection limit, the aqueous solution as a measurement target was measured again after being appropriately concentrated, and the value obtained by the measurement was converted into the concentration of the aqueous solution not yet being concentrated, thereby calculating the content of Ti and Zr.

By using such a method, the content of Ti and Zr with respect to the total mass of periodic acids can be determined to 0.1 ppt by mass.

In the present specification, in a case where the content of Ti and/or Zr with respect to the total mass of periodic acids is less than 0.1 ppt by mass, the aqueous solution (and the periodic acids included in such an aqueous solution) is regarded as not including Ti and/or Zr.

From the measured content of Ti and Zr included in the treated aqueous solution, the content of Ti and Zr with respect to the total mass of the periodic acids in the treated aqueous solution was calculated. The obtained calculation results were classified based on the following standard, and the purification effect of the treatment method in each test example was evaluated.

−: The content is less than 1 ppt by mass.
A: The content is equal to or greater than 1 ppt by mass and less than 1 ppb by mass.
B: The content is equal to or greater than 1 ppb by mass and less than 10 ppb by mass.
C: The content is equal to or greater than 10 ppb by mass and less than 100 ppb by mass.
D: The content is equal to or greater than 100 ppb by mass and equal to or smaller than 1 ppm by mass.
E: The content is greater than 1 ppm by mass and equal to or smaller than 100 ppm by mass.
F: The content is greater than 100 ppm by mass.

Table 1 shows the conditions of each test, and Table 2 shows the overview and results of each test.

In Table 1, the field of "Step B" shows whether or not the aqueous solution treated by the ion exchange method was further subjected to filtration (step B). A means that filtration (step B) was performed, and B means that filtration (step B) was not performed.

In Table 1, the description of "Balance" in the field of "Content" for "Water" shows that the rest of the components other than water described in the table is water.

In Table 1, the description of "Adjusted" in the field of "Content" for "pH adjuster" shows the aqueous solution includes a pH adjuster in such an amount that the aqueous solution has a predetermined pH.

The pH of the aqueous solutions in Examples X115 to X124 was 1.8, 4.0, 4.0, 4.0, 4.0, 4.0, 4.0, 4.0, 4.0, and 4.0 respectively.

In Table 2, the field of "Number of kinds of ion exchange methods" shows the number of kinds of performed methods among the methods A1, A2, and A3.

In Table 2, the field of "Number of kinds of mixed resins" shows the number of mixed resins used in a case where the method A1 was applied.

In Table 2, the field of "Number of kinds of non-mixed resins" shows the number of cation exchange resins, the number of anion exchange resins, and the number of chelating resins used in a case where the method A2 was applied.

In Table 2, the field of "Number of kinds of membranous ion exchangers" shows the number of kinds of membranous ion exchangers used in a case where the method A3 was applied.

In Table 2, the field of "Step B" has the same definition as the field of "Step B" in Table 1.

TABLE 1

| | Water | Formulation of aqueous solution | | | | Ion exchange method Method A1 | | |
| | | Periodic acids | | pH adjuster | | Mixed resin | | |
| | Content | Type | Content (% by mass) | Type | Content (% by mass) | 1 | 2 | 3 |
|---|---|---|---|---|---|---|---|---|
| Example X1 | Balance | Orthoperiodic acid | 37 | | | DS-3 | | |
| Example X2 | Balance | Orthoperiodic acid | 37 | | | DS-7 | | |
| Example X3 | Balance | Orthoperiodic acid | 37 | | | DS-10 | | |
| Example X4 | Balance | Orthoperiodic acid | 37 | | | SMNUPB | | |
| Example X5 | Balance | Orthoperiodic acid | 37 | | | SMT100L | | |

TABLE 1-continued

| | Water | Periodic acids Type | Content (% by mass) | pH adjuster Type |
|---|---|---|---|---|
| Example X6 | Balance | Orthoperiodic acid | 37 | |
| Example X7 | Balance | Orthoperiodic acid | 37 | SMT200L |
| Example X8 | Balance | Orthoperiodic acid | 37 | |
| Example X9 | Balance | Orthoperiodic acid | 37 | |
| Example X10 | Balance | Orthoperiodic acid | 37 | |
| Example X11 | Balance | Orthoperiodic acid | 37 | |
| Example X12 | Balance | Orthoperiodic acid | 37 | |
| Example X13 | Balance | Orthoperiodic acid | 37 | |
| Example X14 | Balance | Orthoperiodic acid | 37 | |
| Example X15 | Balance | Orthoperiodic acid | 37 | |
| Example X16 | Balance | Orthoperiodic acid | 37 | |
| Example X17 | Balance | Orthoperiodic acid | 37 | |
| Example X18 | Balance | Orthoperiodic acid | 37 | |
| Example X19 | Balance | Orthoperiodic acid | 37 | |
| Example X20 | Balance | Orthoperiodic acid | 37 | |
| Example X21 | Balance | Orthoperiodic acid | 37 | |
| Example X22 | Balance | Orthoperiodic acid | 37 | |
| Example X23 | Balance | Orthoperiodic acid | 37 | |

| | Ion exchange method | | | | | | | |
|---|---|---|---|---|---|---|---|---|
| | Method A2 | | | | | Method A3 | | Step |
| | Acidic cation exchange resin | | Basic anion exchange resin | | Chelating resin | Membranous ion exchanger | | |
| | 1 | 2 | 1 | 2 | 1 | 1 | 2 | B |
| Example X1 | | | | | | | | A |
| Example X2 | | | | | | | | A |
| Example X3 | | | | | | | | A |
| Example X4 | | | | | | | | A |
| Example X5 | | | | | | | | A |
| Example X6 | | | | | | | | A |
| Example X7 | DS-1 | | DS-2 | | | | | A |
| Example X8 | DS-1 | | DS-5 | | | | | A |
| Example X9 | DS-1 | | DS-6 | | | | | A |
| Example X10 | DS-4 | | DS-2 | | | | | A |
| Example X11 | DS-4 | | DS-5 | | | | | A |
| Example X12 | DS-4 | | DS-6 | | | | | A |
| Example X13 | SK.1BH | | SA10AOH | | | | | A |
| Example X14 | PK216 | | SA10AOH | | | | | A |
| Example X15 | PK228 | | SA10AOH | | | | | A |
| Example X16 | RCP160M | | SA10AOH | | | | | A |
| Example X17 | C100 | | A500 | | | | | A |
| Example X18 | C150 | | A500 | | | | | A |
| Example X19 | C100 × 16MBH | | A500 | | | | | A |
| Example X20 | C255LFH | | A113LF | | | | | A |
| Example X21 | C255LFH | | A116 | | | | | A |
| Example X22 | C20J | | A113LF | | | | | A |
| Example X23 | C20J | | A116 | | | | | A |

TABLE 2

| | Formulation of aqueous solution | | | | | Ion exchange method | | |
|---|---|---|---|---|---|---|---|---|
| | | Periodic acids | | pH adjuster | | Method A1 | | |
| | Water Content | Type | Content (% by mass) | Type | Content (% by mass) | Mixed resin | | |
| | | | | | | 1 | 2 | 3 |
| Example X24 | Balance | Orthoperiodic acid | 37 | | | | | |
| Example X25 | Balance | Orthoperiodic acid | 37 | | | | | |
| Example X26 | Balance | Orthoperiodic acid | 37 | | | | | |
| Example X27 | Balance | Orthoperiodic acid | 37 | | | | | |
| Example X28 | Balance | Orthoperiodic acid | 37 | | | | | |
| Example X29 | Balance | Orthoperiodic acid | 37 | | | | | |
| Example X30 | Balance | Orthoperiodic acid | 37 | | | | | |

TABLE 2-continued

| | | | | | | | |
|---|---|---|---|---|---|---|---|
| Example X31 | Balance | Orthoperiodic acid | 37 | | DS-3 | DS-77 | |
| Example X32 | Balance | Orthoperiodic acid | 37 | | DS-3 | DS-10 | |
| Example X33 | Balance | Orthoperiodic acid | 37 | | DS-7 | DS-10 | |
| Example X34 | Balance | Orthoperiodic acid | 37 | | DS-7 | DS-10 | |
| Example X35 | Balance | Orthoperiodic acid | 37 | | SMNUPB | SMT100L | |
| Example X36 | Balance | Orthoperiodic acid | 37 | | SMNUPB | SMT200L | |
| Example X37 | Balance | Orthoperiodic acid | 37 | | SMT100L | SMT200L | |
| Example X38 | Balance | Orthoperiodic acid | 37 | | DS-7 | DS-10 | SMT100L |
| Example X39 | Balance | Orthoperiodic acid | 37 | | DS-7 | DS-10 | SMT200L |
| Example X40 | Balance | Orthoperiodic acid | 37 | | DS-7 | SMNUPB | SMT100L |
| Example X41 | Balance | Orthoperiodic acid | 37 | | DS-7 | SMNUPB | SMT200L |
| Example X42 | Balance | Orthoperiodic acid | 37 | | | | |
| Example X43 | Balance | Orthoperiodic acid | 37 | | | | |
| Example X44 | Balance | Orthoperiodic acid | 37 | | | | |
| Example X45 | Balance | Orthoperiodic acid | 37 | | | | |
| Example X46 | Balance | Orthoperiodic acid | 37 | | | | |

| | Ion exchange method | | | | | | |
|---|---|---|---|---|---|---|---|
| | Method A2 | | | | | Method A3 | |
| | Acidic cation exchange resin | | Basic anion exchange resin | | Chelating resin | Membranous ion exchanger | Step |
| | 1 | 2 | 1 | 2 | 1 | 1 | 2 | B |
| Example X24 | DS-1 | | | | | | | A |
| Example X25 | DS-4 | | | | | | | A |
| Example X26 | C100 | | | | S985 | | | A |
| Example X27 | C255LFH | | | | MC700 | | | A |
| Example X28 | C255LFH | | | | MC960 | | | A |
| Example X29 | | | | | | Mustang | | A |
| Example X30 | | | | | | Purifier | | A |
| Example X31 | | | | | | | | A |
| Example X32 | | | | | | | | A |
| Example X33 | | | | | | | | A |
| Example X34 | | | | | | | | B |
| Example X35 | | | | | | | | A |
| Example X36 | | | | | | | | A |
| Example X37 | | | | | | | | A |
| Example X38 | | | | | | | | A |
| Example X39 | | | | | | | | A |
| Example X40 | | | | | | | | A |
| Example X41 | | | | | | | | A |
| Example X42 | 200CT | DS-1 | IRA900J | DS-2 | | | | A |
| Example X43 | 200CT | DS-1 | TRA900J | DS-5 | | | | A |
| Example X44 | 200CT | DS-1 | IRA900J | DS-6 | | | | A |
| Example X45 | 200CT | DS-1 | IRA900J | SA10AOH | | | | A |
| Example X46 | 200CT | DS-4 | IRA900J | DS-2 | | | | A |

TABLE 3

| | Formulation of aqueous solution | | | | | Ion exchange method | | |
|---|---|---|---|---|---|---|---|---|
| | | Periodic acids | | pH adjuster | | Method A1 | | |
| | Water | | Content | | Content | Mixed resin | | |
| | Content | Type | (% by mass) | Type | (% by mass) | 1 | 2 | 3 |
| Example X47 | Balance | Orthoperiodic acid | 37 | | | | | |
| Example X48 | Balance | Orthoperiodic acid | 37 | | | | | |
| Example X49 | Balance | Orthoperiodic acid | 37 | | | | | |
| Example X50 | Balance | Orthoperiodic acid | 37 | | | | | |
| Example X51 | Balance | Orthoperiodic acid | 37 | | | | | |
| Example X52 | Balance | Orthoperiodic acid | 37 | | | | | |
| Example X53 | Balance | Orthoperiodic acid | 37 | | | | | |
| Example X54 | Balance | Orthoperiodic acid | 37 | | | | | |
| Example X55 | Balance | Orthoperiodic acid | 37 | | | | | |
| Example X56 | Balance | Orthoperiodic acid | 37 | | | DS-3 | | |
| Example X57 | Balance | Orthoperiodic acid | 37 | | | DS-7 | | |
| Example X58 | Balance | Orthoperiodic acid | 37 | | | DS-10 | | |
| Example X59 | Balance | Orthoperiodic acid | 37 | | | SMNUPB | | |
| Example X60 | Balance | Orthoperiodic acid | 37 | | | SMT100L | | |
| Example X61 | Balance | Orthoperiodic acid | 37 | | | SMT200L | | |
| Example X62 | Balance | Orthoperiodic acid | 37 | | | DS-3 | | |
| Example X63 | Balance | Orthoperiodic acid | 37 | | | DS-7 | | |
| Example X64 | Balance | Orthoperiodic acid | 37 | | | DS-10 | | |
| Example X65 | Balance | Orthoperiodic acid | 37 | | | SMNUPB | | |
| Example X66 | Balance | Orthoperiodic acid | 37 | | | SMT100L | | |
| Example X67 | Balance | Orthoperiodic acid | 37 | | | SMT200L | | |
| Example X68 | Balance | Orthoperiodic acid | 37 | | | DS-3 | | |
| Example X69 | Balance | Orthoperiodic acid | 37 | | | DS-7 | | |

| | Ion exchange method | | | | | | | |
|---|---|---|---|---|---|---|---|---|
| | Method A2 | | | | | | Method A3 | |
| | Acidic cation exchange resin | | Basic anion exchange resin | | Chelating resin | Membranous ion exchanger | | Step |
| | 1 | 2 | 1 | 2 | 1 | 1 | 2 | B |
| Example X47 | 200CT | DS-4 | IRA900J | DS-5 | | | | A |
| Example X48 | 200CT | DS-4 | IRA900J | DS-6 | | | | A |
| Example X49 | 200CT | DS-4 | IRA900J | SA10AOH | | | | A |
| Example X50 | 200CT | SK1BH | IRA900J | DS-2 | | | | A |
| Example X51 | 200CT | SK1BH | IRA900J | DS-5 | | | | A |
| Example X52 | 200CT | SK1BH | IRA900J | DS-6 | | | | A |
| Example X53 | 200CT | SK1BH | IRA900J | SA10AOH | | | | A |
| Example X54 | 200CT | SK1BH | IRA900J | SA10AOH | | | | B |
| Example X55 | | | | | | Mustang | Purifier | A |
| Example X56 | 200CT | | IRA900J | | | | | A |
| Example X57 | 200CT | | IRA900J | | | | | A |
| Example X58 | 200CT | | IRA900J | | | | | A |
| Example X59 | 200CT | | IRA900J | | | | | A |
| Example X60 | 200CT | | IRA900J | | | | | A |
| Example X61 | 200CT | | IRA900J | | | | | A |
| Example X62 | DS-4 | | DS-5 | | | | | A |
| Example X63 | DS-4 | | DS-5 | | | | | A |
| Example X64 | DS-4 | | DS-5 | | | | | A |
| Example X65 | DS-4 | | DS-5 | | | | | A |
| Example X66 | DS-4 | | DS-5 | | | | | A |
| Example X67 | DS-4 | | DS-5 | | | | | A |
| Example X68 | SK1BH | | DS-2 | | | | | A |
| Example X69 | SK1BH | | DS-2 | | | | | A |

TABLE 4

| | | Formulation of aqueous solution | | | | Ion exchange method Method A1 | | |
|---|---|---|---|---|---|---|---|---|
| | | Periodic acids | | pH adjuster | | Mixed resin | | |
| | Water | | Content | | Content | | | |
| | Content | Type | (% by mass) | Type | (% by mass) | 1 | 2 | 3 |
| Example X70 | Balance | Orthoperiodic acid | 37 | | | DS-10 | | |
| Example X71 | Balance | Orthoperiodic acid | 37 | | | SMNUPB | | |
| Example X72 | Balance | Orthoperiodic acid | 37 | | | SMT100L | | |
| Example X73 | Balance | Orthoperiodic acid | 37 | | | SMT200L | | |
| Example X74 | Balance | Orthoperiodic acid | 37 | | | DS-3 | | |
| Example X75 | Balance | Orthoperiodic acid | 37 | | | DS-7 | | |
| Example X76 | Balance | Orthoperiodic acid | 37 | | | DS-10 | | |
| Example X77 | Balance | Orthoperiodic acid | 37 | | | SMNUPB | | |
| Example X78 | Balance | Orthoperiodic acid | 37 | | | SMT100L | | |
| Example X79 | Balance | Orthoperiodic acid | 37 | | | SMT200L | | |
| Example X80 | Balance | Orthoperiodic acid | 37 | | | DS-3 | DS-7 | |
| Example X81 | Balance | Orthoperiodic acid | 37 | | | DS-3 | DS-10 | |
| Example X82 | Balance | Orthoperiodic acid | 37 | | | DS-7 | DS-10 | |
| Example X83 | Balance | Orthoperiodic acid | 37 | | | SMNUPB | SMT100L | |
| Example X84 | Balance | Orthoperiodic acid | 37 | | | SMNUPB | SMT200L | |
| Example X85 | Balance | Orthoperiodic acid | 37 | | | SMT100L | SMT200L | |
| Example X86 | Balance | Orthoperiodic acid | 37 | | | DS-3 | DS-7 | |
| Example X87 | Balance | Orthoperiodic acid | 37 | | | DS-3 | DS-10 | |
| Example X88 | Balance | Orthoperiodic acid | 37 | | | DS-7 | DS-10 | |
| Example X89 | Balance | Orthoperiodic acid | 37 | | | SMNUPB | SMT100L | |
| Example X90 | Balance | Orthoperiodic acid | 37 | | | SMNUPB | SMT200L | |
| Example X91 | Balance | Orthoperiodic acid | 37 | | | SMT100L | SMT200L | |
| Example X92 | Balance | Orthoperiodic acid | 37 | | | DS-3 | DS-7 | |

| | Ion exchange method | | | | | | | |
|---|---|---|---|---|---|---|---|---|
| | Method A2 | | | | | Method A3 | | |
| | Acidic cation exchange resin | | Basic anion exchange resin | | Chelating resin | Membranous ion exchanger | | Step |
| | 1 | 2 | 1 | 2 | 1 | 1 | 2 | B |
| Example X70 | SK1BH | | DS-2 | | | | | A |
| Example X71 | SK1BH | | DS-2 | | | | | A |
| Example X72 | SK1BH | | DS-2 | | | | | A |
| Example X73 | SK1BH | | DS-2 | | | | | A |
| Example X74 | | | | | | Mustang | Purifier | A |
| Example X75 | | | | | | Mustang | Purifier | A |
| Example X76 | | | | | | Mustang | Purifier | A |
| Example X77 | | | | | | Mustang | Purifier | A |
| Example X78 | | | | | | Mustang | Purifier | A |
| Example X79 | | | | | | Mustang | Purifier | A |
| Example X80 | | | | | | Mustang | | A |
| Example X81 | | | | | | Mustang | | A |
| Example X82 | | | | | | Mustang | | A |
| Example X83 | | | | | | Mustang | | A |
| Example X84 | | | | | | Mustang | | A |
| Example X85 | | | | | | Mustang | | A |
| Example X86 | | | | | | Mustang | | A |
| Example X87 | | | | | | Mustang | | A |
| Example X88 | | | | | | Mustang | | A |
| Example X89 | | | | | | Mustang | | A |
| Example X90 | | | | | | Mustang | | A |
| Example X91 | | | | | | Mustang | | A |
| Example X92 | | | | | | | Purifier | A |

TABLE 5

| | Formulation of aqueous solution | | | | Ion exchange method | | |
|---|---|---|---|---|---|---|---|
| | | Periodic acids | | pH adjuster | | Method A1 | |
| | Water | | Content | | Content | Mixed resin | | |
| | Content | Type | (% by mass) | Type | (% by mass) | 1 | 2 | 3 |
| Example X93 | Balance | Orthoperiodic acid | 37 | | | DS-3 | DS-10 | |
| Example X94 | Balance | Orthoperiodic acid | 37 | | | DS-7 | DS-10 | |
| Example X95 | Balance | Orthoperiodic acid | 37 | | | SMNUPB | SMT100L | |
| Example X96 | Balance | Orthoperiodic acid | 37 | | | SMNUPB | SMT200L | |
| Example X97 | Balance | Orthoperiodic acid | 37 | | | SMT100L | SMT200L | |
| Example X98 | Balance | Orthoperiodic acid | 37 | | | DS-3 | DS-7 | |
| Example X99 | Balance | Orthoperiodic acid | 37 | | | DS-3 | DS-10 | |
| Example X100 | Balance | Orthoperiodic acid | 37 | | | DS-7 | DS-10 | |
| Example X101 | Balance | Orthoperiodic acid | 37 | | | SMNUPB | SMT100L | |
| Example X102 | Balance | Orthoperiodic acid | 37 | | | SMNUPB | SMT200L | |
| Example X103 | Balance | Orthoperiodic acid | 37 | | | SMT100L | SMT200L | |
| Example X104 | Balance | Orthoperiodic acid | 37 | | | | | |
| Example X105 | Balance | Orthoperiodic acid | 37 | | | | | |
| Example X106 | Balance | Orthoperiodic acid | 37 | | | | | |
| Example X107 | Balance | Orthoperiodic acid | 37 | | | | | |
| Example X108 | Balance | Orthoperiodic acid | 37 | | | | | |
| Example X109 | Balance | Orthoperiodic acid | 37 | | | | | |
| Example X110 | Balance | Orthoperiodic acid | 37 | | | | | |
| Example X111 | Balance | Orthoperiodic acid | 37 | | | | | |
| Example X112 | Balance | Orthoperiodic acid | 37 | | | | | |
| Example X113 | Balance | Orthoperiodic acid | 37 | | | DS-10 | | |
| Example X114 | Balance | Orthoperiodic acid | 37 | | | SMNUPB | | |
| Example X115 | Balance | Orthoperiodic acid | 5 | | | DS-7 | DS-10 | |

| | Ion exchange method | | | | | | |
|---|---|---|---|---|---|---|---|
| | Method A2 | | | | | Method A3 | |
| | Acidic cation exchange resin | | Basic anion exchange resin | | Chelating resin | Membranous ion exchanger | | Step |
| | 1 | 2 | 1 | 2 | 1 | 2 | B |
| Example X93 | | | | | | Purifier | A |
| Example X94 | | | | | | Purifier | A |
| Example X95 | | | | | | Purifier | A |
| Example X96 | | | | | | Purifier | A |
| Example X97 | | | | | | Purifier | A |
| Example X98 | | | | | | Purifier | A |
| Example X99 | | | | | | Purifier | A |
| Example X100 | | | | | | Purifier | A |
| Example X101 | | | | | | Purifier | A |
| Example X102 | | | | | | Purifier | A |
| Example X103 | | | | | | Purifier | A |
| Example X104 | 200CT | | IRA900J | | Mustang | | A |
| Example X105 | DS-4 | | DS-5 | | Mustang | | A |
| Example X106 | SK1BH | | DS-2 | | Mustang | | A |
| Example X107 | 200CT | | IRA900J | | | Purifier | A |
| Example X108 | DS-4 | | DS-5 | | | Purifier | A |
| Example X109 | SK1BH | | DS-2 | | | Purifier | A |
| Example X110 | 200CT | | IRA900J | | Mustang | Purifier | A |
| Example X111 | DS-4 | | DS-5 | | Mustang | Purifier | A |
| Example X112 | SK1BH | | DS-2 | | Mustang | Purifier | A |
| Example X113 | DS-4 | | DS-5 | | Mustang | | A |
| Example X114 | SK1BH | | DS-2 | | Mustang | | A |
| Example X115 | | | | | | | A |

TABLE 6

| | Formulation of aqueous solution | | | | | Ion exchange method Method A1 | | |
|---|---|---|---|---|---|---|---|---|
| | Water | Periodic acids | | pH adjuster | | Mixed resin | | |
| | Content | Type | Content (% by mass) | Type | Content (% by mass) | 1 | 2 | 3 |
| Example X116 | Balance | Orthoperiodic acid | 5 | TEAH | Adjusted | DS-7 | DS-10 | |
| Example X117 | Balance | Orthoperiodic acid | 5 | TEAH | Adjusted | DS-7 | | |
| Example X118 | Balance | Orthoperiodic acid | 5 | TEAH | Adjusted | DS-7 | | |
| Example X119 | Balance | Orthoperiodic acid | 5 | TEAH | Adjusted | SMNUPB | SMT100L | |
| Example X120 | Balance | Orthoperiodic acid | 5 | TEAH | Adjusted | SMNUPB | | |
| Example X121 | Balance | Orthoperiodic acid | 5 | TEAH | Adjusted | SMNUPB | | |
| Example X122 | Balance | Orthoperiodic acid | 5 | TMAH | Adjusted | DS-7 | DS-10 | |
| Example X123 | Balance | Orthoperiodic acid | 5 | TBAH | Adjusted | DS-7 | DS-10 | |
| Example X124 | Balance | Orthoperiodic acid | 5 | DBU | Adjusted | DS-7 | DS-10 | |
| Comparative Example X1 | Balance | Orthoperiodic acid | 37 | | | | | |
| Comparative Example X2 | Balance | Orthoperiodic acid | 37 | | | | | |
| Comparative Example X3 | Balance | Orthoperiodic acid | 37 | | | DS-7 | SMNUPB | SMT200L |

| | Ion exchange method | | | | | | | |
|---|---|---|---|---|---|---|---|---|
| | Method A2 | | | | | Method A3 | | |
| | Acidic cation exchange resin | | Basic anion exchange resin | | Chelating resin | Membranous ion exchanger | | Step |
| | 1 | 2 | 1 | 2 | 1 | 1 | 2 | B |
| Example X116 | | | | | | | | A |
| Example X117 | DS-4 | | DS-5 | | | | | A |
| Example X118 | | | | | | Mustang | | A |
| Example X119 | | | | | | | | A |
| Example X120 | DS-4 | | DS-5 | | | | | A |
| Example X121 | | | | | | Mustang | | A |
| Example X122 | | | | | | | | A |
| Example X123 | | | | | | | | A |
| Example X124 | | | | | | | | A |
| Comparative Example X1 | | | | | | | | A |
| Comparative Example X2 | | | | | | | | B |
| Comparative Example X3 | 200CT | SK1BH | IRA900J | SA10AOH | | Mustang | Purifier | A |

TABLE 7

| | Formulation of aqueous solution | | | | | Overview of test Number of kinds of ion exchange methods |
|---|---|---|---|---|---|---|
| | Water Content | Periodic acids | | pH adjuster | | |
| | | Type | Content (% by mass) | Type | Content (% by mass) | |
| Example X1 | Balance | Orthoperiodic acid | 37 | | | 1 |
| Example X2 | Balance | Orthoperiodic acid | 37 | | | 1 |
| Example X3 | Balance | Orthoperiodic acid | 37 | | | 1 |
| Example X4 | Balance | Orthoperiodic acid | 37 | | | 1 |
| Example X5 | Balance | Orthoperiodic acid | 37 | | | 1 |
| Example X6 | Balance | Orthoperiodic acid | 37 | | | 1 |
| Example X7 | Balance | Orthoperiodic acid | 37 | | | 1 |

TABLE 7-continued

| | | | | |
|---|---|---|---|---|
| Example X8 | Balance | Orthoperiodic acid | 37 | 1 |
| Example X9 | Balance | Orthoperiodic acid | 37 | 1 |
| Example X10 | Balance | Orthoperiodic acid | 37 | 1 |
| Example X11 | Balance | Orthoperiodic acid | 37 | 1 |
| Example X12 | Balance | Orthoperiodic acid | 37 | 1 |
| Example X13 | Balance | Orthoperiodic acid | 37 | 1 |
| Example X14 | Balance | Orthoperiodic acid | 37 | 1 |
| Example X15 | Balance | Orthoperiodic acid | 37 | 1 |
| Example X16 | Balance | Orthoperiodic acid | 37 | 1 |
| Example X17 | Balance | Orthoperiodic acid | 37 | 1 |
| Example X18 | Balance | Orthoperiodic acid | 37 | 1 |
| Example X19 | Balance | Orthoperiodic acid | 37 | 1 |
| Example X20 | Balance | Orthoperiodic acid | 37 | 1 |
| Example X21 | Balance | Orthoperiodic acid | 37 | 1 |
| Example X22 | Balance | Orthoperiodic acid | 37 | 1 |
| Example X23 | Balance | Orthoperiodic acid | 37 | 1 |
| Example X24 | Balance | Orthoperiodic acid | 37 | 1 |
| Example X25 | Balance | Orthoperiodic acid | 37 | 1 |
| Example X26 | Balance | Orthoperiodic acid | 37 | 1 |
| Example X27 | Balance | Orthoperiodic acid | 37 | 1 |
| Example X28 | Balance | Orthoperiodic acid | 37 | 1 |
| Example X29 | Balance | Orthoperiodic acid | 37 | 1 |
| Example X30 | Balance | Orthoperiodic acid | 37 | 1 |

| | Overview of test | | | | | | |
|---|---|---|---|---|---|---|---|
| | Number of kinds of mixed resins | Number of kinds of non-mixed resins | Number of kinds of membranous ion exchangers | Step B | pH adjuster | Purification effect Ti | Zr |
| Example X1 | 1 | 0 | 0 | A | B | D | D |
| Example X2 | 1 | 0 | 0 | A | B | D | D |
| Example X3 | 1 | 0 | 0 | A | B | D | D |
| Example X4 | 1 | 0 | 0 | A | B | D | D |
| Example X5 | 1 | 0 | 0 | A | B | D | D |
| Example X6 | 1 | 0 | 0 | A | B | D | D |
| Example X7 | 0 | 1 | 0 | A | B | D | D |
| Example X8 | 0 | 1 | 0 | A | B | D | D |
| Example X9 | 0 | 1 | 0 | A | B | D | D |
| Example X10 | 0 | 1 | 0 | A | B | D | D |
| Example X11 | 0 | 1 | 0 | A | B | D | D |
| Example X12 | 0 | 1 | 0 | A | B | D | D |
| Example X13 | 0 | 1 | 0 | A | B | D | D |
| Example X14 | 0 | 1 | 0 | A | B | D | D |
| Example X15 | 0 | 1 | 0 | A | B | D | D |
| Example X16 | 0 | 1 | 0 | A | B | D | D |
| Example X17 | 0 | 1 | 0 | A | B | D | D |
| Example X18 | 0 | 1 | 0 | A | B | D | D |
| Example X19 | 0 | 1 | 0 | A | B | D | D |
| Example X20 | 0 | 1 | 0 | A | B | D | D |
| Example X21 | 0 | 1 | 0 | A | B | D | D |
| Example X22 | 0 | 1 | 0 | A | B | D | D |
| Example X23 | 0 | 1 | 0 | A | B | D | D |
| Example X24 | 0 | 1 | 0 | A | B | D | D |
| Example X25 | 0 | 1 | 0 | A | B | D | D |
| Example X26 | 0 | 1 | 0 | A | B | C | C |
| Example X27 | 0 | 1 | 0 | A | B | C | C |
| Example X28 | 0 | 1 | 0 | A | B | C | C |
| Example X29 | 0 | 0 | 1 | A | B | D | D |
| Example X30 | 0 | 0 | 1 | A | B | D | D |

TABLE 8

| | Formulation of aqueous solution | | | | | Overview of test |
|---|---|---|---|---|---|---|
| | | Periodic acids | | pH adjuster | | |
| | Water Content | Type | Content (% by mass) | Type | Content (% by mass) | Number of kinds of ion exchange methods |
| Example X31 | Balance | Orthoperiodic acid | 37 | | | 1 |
| Example X32 | Balance | Orthoperiodic acid | 37 | | | 1 |

TABLE 8-continued

| | | | | |
|---|---|---|---|---|
| Example X33 | Balance | Orthoperiodic acid | 37 | 1 |
| Example X34 | Balance | Orthoperiodic acid | 37 | 1 |
| Example X35 | Balance | Orthoperiodic acid | 37 | 1 |
| Example X36 | Balance | Orthoperiodic acid | 37 | 1 |
| Example X37 | Balance | Orthoperiodic acid | 37 | 1 |
| Example X38 | Balance | Orthoperiodic acid | 37 | 1 |
| Example X39 | Balance | Orthoperiodic acid | 37 | 1 |
| Example X40 | Balance | Orthoperiodic acid | 37 | 1 |
| Example X41 | Balance | Orthoperiodic acid | 37 | 1 |
| Example X42 | Balance | Orthoperiodic acid | 37 | 1 |
| Example X43 | Balance | Orthoperiodic acid | 37 | 1 |
| Example X44 | Balance | Orthoperiodic acid | 37 | 1 |
| Example X45 | Balance | Orthoperiodic acid | 37 | 1 |
| Example X46 | Balance | Orthoperiodic acid | 37 | 1 |
| Example X47 | Balance | Orthoperiodic acid | 37 | 1 |
| Example X48 | Balance | Orthoperiodic acid | 37 | 1 |
| Example X49 | Balance | Orthoperiodic acid | 37 | 1 |
| Example X50 | Balance | Orthoperiodic acid | 37 | 1 |
| Example X51 | Balance | Orthoperiodic acid | 37 | 1 |
| Example X52 | Balance | Orthoperiodic acid | 37 | 1 |
| Example X53 | Balance | Orthoperiodic acid | 37 | 1 |
| Example X54 | Balance | Orthoperiodic acid | 37 | 1 |
| Example X55 | Balance | Orthoperiodic acid | 37 | 1 |
| Example X56 | Balance | Orthoperiodic acid | 37 | 2 |
| Example X57 | Balance | Orthoperiodic acid | 37 | 2 |
| Example X58 | Balance | Orthoperiodic acid | 37 | 2 |
| Example X59 | Balance | Orthoperiodic acid | 37 | 2 |
| Example X60 | Balance | Orthoperiodic acid | 37 | 2 |

| | Overview of test | | | | | | |
|---|---|---|---|---|---|---|---|
| | Number of kinds of mixed resins | Number of kinds of non-mixed resins | Number of kinds of membranous ion exchangers | Step B | pH adjuster | Purification effect | |
| | | | | | | Ti | Zr |
| Example X31 | 2 | 0 | 0 | A | B | C | C |
| Example X32 | 2 | 0 | 0 | A | B | C | C |
| Example X33 | 2 | 0 | 0 | A | B | C | C |
| Example X34 | 2 | 0 | 0 | B | B | C | C |
| Example X35 | 2 | 0 | 0 | A | B | C | C |
| Example X36 | 2 | 0 | 0 | A | B | C | C |
| Example X37 | 2 | 0 | 0 | A | B | C | C |
| Example X38 | 3 | 0 | 0 | A | B | B | B |
| Example X39 | 3 | 0 | 0 | A | B | B | B |
| Example X40 | 3 | 0 | 0 | A | B | B | B |
| Example X41 | 3 | 0 | 0 | A | B | B | B |
| Example X42 | 0 | 2 | 0 | A | B | C | C |
| Example X43 | 0 | 2 | 0 | A | B | C | C |
| Example X44 | 0 | 2 | 0 | A | B | C | C |
| Example X45 | 0 | 2 | 0 | A | B | C | C |
| Example X46 | 0 | 2 | 0 | A | B | C | C |
| Example X47 | 0 | 2 | 0 | A | B | C | C |
| Example X48 | 0 | 2 | 0 | A | B | C | C |
| Example X49 | 0 | 2 | 0 | A | B | C | C |
| Example X50 | 0 | 2 | 0 | A | B | C | C |
| Example X51 | 0 | 2 | 0 | A | B | C | C |
| Example X52 | 0 | 2 | 0 | A | B | C | C |
| Example X53 | 0 | 2 | 0 | A | B | C | C |
| Example X54 | 0 | 2 | 0 | B | B | C | C |
| Example X55 | 0 | 0 | 2 | A | B | C | C |
| Example X56 | 1 | 1 | 0 | A | B | C | C |
| Example X57 | 1 | 1 | 0 | A | B | C | C |
| Example X58 | 1 | 1 | 0 | A | B | C | C |
| Example X59 | 1 | 1 | 0 | A | B | C | C |
| Example X60 | 1 | 1 | 0 | A | B | C | C |

TABLE 9

| | Formulation of aqueous solution | | | | | Overview of test |
|---|---|---|---|---|---|---|
| | | Periodic acids | | pH adjuster | | Number of kinds of ion exchange methods |
| | Water Content | Type | Content (% by mass) | Type | Content (% by mass) | |
| Example X61 | Balance | Orthoperiodic acid | 37 | | | 2 |
| Example X62 | Balance | Orthoperiodic acid | 37 | | | 2 |
| Example X63 | Balance | Orthoperiodic acid | 37 | | | 2 |
| Example X64 | Balance | Orthoperiodic acid | 37 | | | 2 |
| Example X65 | Balance | Orthoperiodic acid | 37 | | | 2 |
| Example X66 | Balance | Orthoperiodic acid | 37 | | | 2 |
| Example X67 | Balance | Orthoperiodic acid | 37 | | | 2 |
| Example X68 | Balance | Orthoperiodic acid | 37 | | | 2 |
| Example X69 | Balance | Orthoperiodic acid | 37 | | | 2 |
| Example X70 | Balance | Orthoperiodic acid | 37 | | | 2 |
| Example X71 | Balance | Orthoperiodic acid | 37 | | | 2 |
| Example X72 | Balance | Orthoperiodic acid | 37 | | | 2 |
| Example X73 | Balance | Orthoperiodic acid | 37 | | | 2 |
| Example X74 | Balance | Orthoperiodic acid | 37 | | | 2 |
| Example X75 | Balance | Orthoperiodic acid | 37 | | | 2 |
| Example X76 | Balance | Orthoperiodic acid | 37 | | | 2 |
| Example X77 | Balance | Orthoperiodic acid | 37 | | | 2 |
| Example X78 | Balance | Orthoperiodic acid | 37 | | | 2 |
| Example X79 | Balance | Orthoperiodic acid | 37 | | | 2 |
| Example X80 | Balance | Orthoperiodic acid | 37 | | | 2 |
| Example X81 | Balance | Orthoperiodic acid | 37 | | | 2 |
| Example X82 | Balance | Orthoperiodic acid | 37 | | | 2 |
| Example X83 | Balance | Orthoperiodic acid | 37 | | | 2 |
| Example X84 | Balance | Orthoperiodic acid | 37 | | | 2 |
| Example X85 | Balance | Orthoperiodic acid | 37 | | | 2 |
| Example X86 | Balance | Orthoperiodic acid | 37 | | | 2 |
| Example X87 | Balance | Orthoperiodic acid | 37 | | | 2 |
| Example X88 | Balance | Orthoperiodic acid | 37 | | | 2 |
| Example X89 | Balance | Orthoperiodic acid | 37 | | | 2 |
| Example X90 | Balance | Orthoperiodic acid | 37 | | | 2 |

| | Overview of test | | | | | Purification effect | |
|---|---|---|---|---|---|---|---|
| | Number of kinds of mixed resins | Number of kinds of non-mixed resins | Number of kinds of membranous ion ion exchangers | Step B | pH adjuster | Ti | Zr |
| Example X61 | 1 | 1 | 0 | A | B | C | C |
| Example X62 | 1 | 1 | 0 | A | B | C | C |
| Example X63 | 1 | 1 | 0 | A | B | C | C |
| Example X64 | 1 | 1 | 0 | A | B | C | C |
| Example X65 | 1 | 1 | 0 | A | B | C | C |
| Example X66 | 1 | 1 | 0 | A | B | C | C |
| Example X67 | 1 | 1 | 0 | A | B | C | C |
| Example X68 | 1 | 1 | 0 | A | B | C | C |
| Example X69 | 1 | 1 | 0 | A | B | C | C |
| Example X70 | 1 | 1 | 0 | A | B | C | C |
| Example X71 | 1 | 1 | 0 | A | B | C | C |
| Example X72 | 1 | 1 | 0 | A | B | C | C |
| Example X73 | 1 | 1 | 0 | A | B | C | C |
| Example X74 | 1 | 0 | 2 | A | B | B | B |
| Example X75 | 1 | 0 | 2 | A | B | B | B |
| Example X76 | 1 | 0 | 2 | A | B | B | B |
| Example X77 | 1 | 0 | 2 | A | B | B | B |
| Example X78 | 1 | 0 | 2 | A | B | B | B |
| Example X79 | 1 | 0 | 2 | A | B | B | B |
| Example X80 | 2 | 0 | 1 | A | B | B | B |
| Example X81 | 2 | 0 | 1 | A | B | B | B |
| Example X82 | 2 | 0 | 1 | A | B | B | B |
| Example X83 | 2 | 0 | 1 | A | B | B | B |
| Example X84 | 2 | 0 | 1 | A | B | B | B |
| Example X85 | 2 | 0 | 1 | A | B | B | B |
| Example X86 | 2 | 0 | 1 | A | B | B | B |
| Example X87 | 2 | 0 | 1 | A | B | B | B |
| Example X88 | 2 | 0 | 1 | A | B | B | B |
| Example X89 | 2 | 0 | 1 | A | B | B | B |
| Example X90 | 2 | 0 | 1 | A | B | B | B |

TABLE 10

| | Formulation of aqueous solution | | | | | Overview of test Number of kinds of ion exchange methods |
|---|---|---|---|---|---|---|
| | | Periodic acids | | pH adjuster | | |
| | Water Content | Type | Content (% by mass) | Type | Content (% by mass) | |
| Example X91 | Balance | Orthoperiodic acid | 37 | | | 2 |
| Example X92 | Balance | Orthoperiodic acid | 37 | | | 2 |
| Example X93 | Balance | Orthoperiodic acid | 37 | | | 2 |
| Example X94 | Balance | Orthoperiodic acid | 37 | | | 2 |
| Example X95 | Balance | Orthoperiodic acid | 37 | | | 2 |
| Example X96 | Balance | Orthoperiodic acid | 37 | | | 2 |
| Example X97 | Balance | Orthoperiodic acid | 37 | | | 2 |
| Example X98 | Balance | Orthoperiodic acid | 37 | | | 2 |
| Example X99 | Balance | Orthoperiodic acid | 37 | | | 2 |
| Example X100 | Balance | Orthoperiodic acid | 37 | | | 2 |
| Example X101 | Balance | Orthoperiodic acid | 37 | | | 2 |
| Example X102 | Balance | Orthoperiodic acid | 37 | | | 2 |
| Example X103 | Balance | Orthoperiodic acid | 37 | | | 2 |
| Example X104 | Balance | Orthoperiodic acid | 37 | | | 2 |
| Example X105 | Balance | Orthoperiodic acid | 37 | | | 2 |
| Example X106 | Balance | Orthoperiodic acid | 37 | | | 2 |
| Example X107 | Balance | Orthoperiodic acid | 37 | | | 2 |
| Example X108 | Balance | Orthoperiodic acid | 37 | | | 2 |
| Example X109 | Balance | Orthoperiodic acid | 37 | | | 2 |
| Example X110 | Balance | Orthoperiodic acid | 37 | | | 2 |
| Example X111 | Balance | Orthoperiodic acid | 37 | | | 2 |
| Example X112 | Balance | Orthoperiodic acid | 37 | | | 2 |
| Example X113 | Balance | Orthoperiodic acid | 37 | | | 3 |
| Example X114 | Balance | Orthoperiodic acid | 37 | | | 3 |
| Example X115 | Balance | Orthoperiodic acid | 5 | | | 1 |
| Example X116 | Balance | Orthoperiodic acid | 5 | TEAH | Adjusted | 1 |
| Example X117 | Balance | Orthoperiodic acid | 5 | TEAH | Adjusted | 2 |
| Example X118 | Balance | Orthoperiodic acid | 5 | TEAH | Adjusted | 2 |
| Example X119 | Balance | Orthoperiodic acid | 5 | TEAH | Adjusted | 1 |
| Example X120 | Balance | Orthoperiodic acid | 5 | TEAH | Adjusted | 2 |

| | Overview of test | | | | | Purification effect | |
|---|---|---|---|---|---|---|---|
| | Number of kinds of mixed resins | Number of kinds of non-mixed resins | Number of kinds of membranous ion exchangers | Step B | pH adjuster | Ti | Zr |
| Example X91 | 2 | 0 | 1 | A | B | B | B |
| Example X92 | 2 | 0 | 1 | A | B | B | B |
| Example X93 | 2 | 0 | 1 | A | B | B | B |
| Example X94 | 2 | 0 | 1 | A | B | B | B |
| Example X95 | 2 | 0 | 1 | A | B | B | B |
| Example X96 | 2 | 0 | 1 | A | B | B | B |
| Example X97 | 2 | 0 | 1 | A | B | B | B |
| Example X98 | 2 | 0 | 1 | A | B | B | B |
| Example X99 | 2 | 0 | 1 | A | B | B | B |
| Example X100 | 2 | 0 | 1 | A | B | B | B |
| Example X101 | 2 | 0 | 1 | A | B | B | B |
| Example X102 | 2 | 0 | 1 | A | B | B | B |
| Example X103 | 2 | 0 | 1 | A | B | B | B |
| Example X104 | 0 | 1 | 1 | A | B | C | C |
| Example X105 | 0 | 1 | 1 | A | B | C | C |
| Example X106 | 0 | 1 | 1 | A | B | C | C |
| Example X107 | 0 | 1 | 1 | A | B | C | C |
| Example X108 | 0 | 1 | 1 | A | B | C | C |
| Example X109 | 0 | 1 | 1 | A | B | C | C |
| Example X110 | 0 | 1 | 2 | A | B | B | B |
| Example X111 | 0 | 1 | 2 | A | B | B | B |
| Example X112 | 0 | 1 | 2 | A | B | B | B |
| Example X113 | 1 | 1 | 1 | A | B | A | A |
| Example X114 | 1 | 1 | 1 | A | B | A | A |
| Example X115 | 2 | 0 | 0 | A | B | C | C |
| Example X116 | 2 | 0 | 0 | A | A | B | B |
| Example X117 | 1 | 1 | 0 | A | A | B | B |
| Example X118 | 1 | 0 | 1 | A | A | B | B |
| Example X119 | 2 | 0 | 0 | A | A | B | B |
| Example X120 | 1 | 1 | 0 | A | A | B | B |

TABLE 11

| | Formulation of aqueous solution | | | | | Overview of test |
|---|---|---|---|---|---|---|
| | | Periodic acids | | pH adjuster | | Number of kinds of ion exchange methods |
| | Water Content | Type | Content (% by mass) | Type | Content (% by mass) | |
| Example X121 | Balance | Orthoperiodic acid | 5 | TEAH | Adjusted | 2 |
| Example X122 | Balance | Orthoperiodic acid | 5 | TMAH | Adjusted | 1 |
| Example X123 | Balance | Orthoperiodic acid | 5 | TBAH | Adjusted | 1 |
| Example X124 | Balance | Orthoperiodic acid | 5 | DBU | Adjusted | 1 |
| Comparative Example X1 | Balance | Orthoperiodic acid | 37 | | | 0 |
| Comparative Example X2 | Balance | Orthoperiodic acid | 37 | | | 0 |
| Comparative Example X3 | Balance | Orthoperiodic acid | 37 | | | 3 |

| | Overview of test | | | | | | | |
|---|---|---|---|---|---|---|---|---|
| | Number of kinds of mixed resins | Number of kinds of non-mixed resins | Number of kinds of membranous ion exchangers | Step B | pH adjuster | Purification effect | | |
| | | | | | | Ti | Zr | |
| Example X121 | 1 | 0 | 1 | A | A | B | B | |
| Example X122 | 2 | 0 | 0 | A | A | B | B | |
| Example X123 | 2 | 0 | 0 | A | A | B | B | |
| Example X124 | 2 | 0 | 0 | A | A | B | B | |
| Comparative Example X1 | 0 | 0 | 0 | A | B | F | F | |
| Comparative Example X2 | 0 | 0 | 0 | B | B | F | F | |
| Comparative Example X3 | 3 | 2 | 2 | A | B | — | — | |

From the results shown in Table 2, it has been confirmed that by the manufacturing method according to the embodiment of the present invention, the chemical solution according to the embodiment of the present invention can be efficiently obtained.

In addition, it has been confirmed that the greater the number of requirements satisfied among (i) application of a plurality of kinds of methods among the methods A1 to A3, (ii) use of a plurality of mixed resins at the time of applying the method A1 (use of the method A12), (iii) use of a plurality of cation exchange resins and a plurality of anion exchange resins at the time of applying the method A2 (application of the method A22), (iv) use of a plurality of membranous ion exchangers at the time of applying the step A3 (application of the method A32), and (V) use of a chelating resin at the time of applying the method A2, the better the purification effect (the results of Examples X1 to X114 and the like).

It has been confirmed that in a case where all of the methods A1 to A3 are performed in the case of (i) application of a plurality of kinds of methods among the methods A1 to A3, the purification effect is further improved (results of Examples X113 and X114 and the like).

It has been confirmed that in a case where three or more mixed resins are used in the case of (ii) application of the method A12, the purification effect is further improved (the results of Examples X38 to X41 and the like).

Furthermore, it has been confirmed that in a case where the aqueous solution to be treated includes a pH adjuster, the purification effect is further improved (the results of Examples X115 to X124).

Example Y

[Preparation of Chemical Solution]
<Raw Materials>
The chemical solutions used in examples and comparative examples were prepared using the following raw materials.
(Water)
Water: ultrapure water (ultrapure water manufactured by an ultrapure water manufacturing device "PURELAB Ultra" (manufactured by ORGANO CORPORATION))
(Periodic Acids)
Orthoperiodic acid: reagent A (orthoperiodic acid including Ti and Zr)
Orthoperiodic acid: reagent B (orthoperiodic acid including Ti)
Orthoperiodic acid: reagent C (orthoperiodic acid including Zr)
(pH Adjuster)
TMAH: Tetramethylammonium hydroxide
TEAH: Tetraethylammonium hydroxide
TBAH: Tetrabutylammonium hydroxide
DBU: diazabicycloundecene
All the pH adjusters described above were classified as a semiconductor grade.
(Source of Ammonium Ions)
$NH_3^+$: aqueous ammonia (semiconductor grade)
(Source of Anionic Species)
$I^-$: hydrogen iodide
$I_3^-$: ammonium triiodide
$IO_3^-$: iodic acid Br⁻: hydrogen bromide
Cl⁻: hydrochloric acid
$NO_3^-$: nitric acid
Sulfate ion: sulfuric acid
Sulfite ion: sulfite
Phosphate ion: phosphoric acid
Phosphite ion: phosphorous acid All the sources of anionic species described above are all classified as a semiconductor grade.

Preparation of Chemical Solution

Example Y3

The aqueous solution was treated (ion exchange method) in the same manner as in Example X1, thereby obtaining a chemical solution having the formulation shown in Table 3.

Example Y6

A chemical solution was prepared according to the same procedure as in Example Y3, except that the filtration (step B) was not performed.

Example Y9

The aqueous solution was treated (ion exchange method) in the same manner as in Example X31, thereby obtaining a chemical solution having the formulation shown in Table 3.

Example Y12

The aqueous solution was treated (ion exchange method) in the same manner as in Example X80, thereby obtaining a chemical solution having the formulation shown in Table 3.

Example Y15

The aqueous solution was treated (ion exchange method) in the same manner as in Example X115, thereby obtaining a chemical solution having the formulation shown in Table 3.

Examples Y16 to Y27

A chemical solution was prepared according to the same procedure as in Example Y15, except that a pH adjuster was added to the aqueous solution to be treated such that the pH of the obtained chemical solution became the value shown in Table 3.

Examples Y28 to Y30

Chemical solutions were prepared according to the same procedure as in Example Y9, except that a source of ammonium ions or a source of anionic species was added to the aqueous solution to be treated such that the obtained chemical solutions had the formulation shown in Table 3.

Examples Y1, Y2, Y4, Y5, Y7, Y8, Y10, Y11, Y13, and Y14

A chemical solution of Example Y1 was prepared according to the same procedure as in Example Y3, except that the reagent B was used instead of the reagent A. A chemical solution of Example Y2 was prepared according to the same procedure as in Example Y3, except that the reagent C was used instead of the reagent A.

Likewise, chemical solutions of Examples Y4, Y5, Y7, Y8, Y10, Y11, Y13, and Y14 were prepared according to the same procedure as in Examples Y6, Y9, Y12, or Y15, except that the reagent B or the reagent C was used instead of the reagent A.

Comparative Example Y1

Orthoperiodic acid (reagent A) was dissolved in water, and the obtained aqueous solution was filtered by the same method as that described in Example X without being subjected to the treatment method using an ion exchange method, thereby obtaining a chemical solution of Comparative Example Y1.

Comparative Example Y2

Orthoperiodic acid (reagent A) was dissolved in water, and the obtained aqueous solution was used as a chemical solution of Comparative Example Y2.

Comparative Example Y3

The aqueous solution obtained by being treated by the same method as that in Comparative Example X3 was used as a chemical solution of Comparative Example Y3.

Comparative Examples Y4 and Y5

A chemical solution of Comparative Example Y4 was prepared according to the same procedure as in Comparative Example Y1, except that the reagent B was used instead of the reagent A. A chemical solution of Comparative Example Y5 was prepared according to the same procedure as in Comparative Example Y1, except that the reagent C was used instead of the reagent A.

The content of Ti and Zn in each chemical solution was checked by the same method (ICP-MS) as that described in Example X.

The content of the above components in each chemical solution is as shown in Table 3. In Table 3, the components not descried in the fields of each chemical solution are components that are not included in the chemical solution.

The content of anionic species and ammonium ions was checked by ion chromatography (using DIONEX ICS-2100 manufactured by Thermo Fisher Scientific Inc.).

[Test and Evaluation]
<Ru Etching Performance>

Substrates were prepared in which a ruthenium layer was formed on one surface of a commercial silicon wafer (diameter: 12 inches) by a chemical vapor deposition (CVD) method.

Each of the obtained substrates was put in a container filled with the chemical solution of each of the examples or comparative examples, and the chemical solution was stirred for 0.5 minutes to perform a ruthenium layer removal treatment. The temperature of the chemical solution was 25° C.

From the difference in the thickness of the ruthenium layer before and after the treatment, the etching rate of the chemical solution for ruthenium was calculated and evaluated based on the following standard.

A: equal to or higher than 600 Å/min
B: equal to or higher than 300 Å/min and less than 600 Å/min C: equal to or higher than 50 Å/min and less than 300 Å/min D: less than 50 Å/min <Co Etching Performance and W Etching Performance>

For cobalt and tungsten, the etching performance was evaluated using the same method and standard as those used for evaluating the Ru etching performance.

<Residual Metal Inhibition Properties>

The chemical solution of each of the examples and comparative examples was sprayed for 1 minute on a silicon wafer having a diameter of 300 mm at a flow rate of 1.5 L/min. Then, water was sprayed for 1 minute on the silicon water at a flow rate of 1.5 L/min, and finally, a nitrogen gas was sprayed on the silicon wafer at a flow rate of 50 L/min.

Thereafter, the surface of the silicon wafer was measured by Electron Spectroscopy for Chemical Analysis (ESCA, device name: PHI Quantera SXMTM), and the concentration of residual metal atoms on the surface of the silicon wafer (atoms/cm$^2$) was measured and evaluated according to the following standard.

According to this evaluation, the better the residual metal inhibition properties of the chemical solution, the better the defect inhibition performance of the chemical solution.

A: less than $1\times10^7$ atoms/cm$^2$

B: equal to or higher than $1\times10^7$ atoms/cm$^2$ and less than $1\times10^8$ atoms/cm$^2$ C: equal to or higher than $1\times10^8$ atoms/cm$^2$ and less than $1\times10^9$ atoms/cm$^2$ D: equal to or higher than $1\times10^9$ atoms/cm$^2$ and less than $1\times10^{10}$ atoms/cm$^2$ E: equal to or higher than $1\times10^{10}$ atoms/cm$^2$ <Smoothness (Roughness)>

With reference to the method for evaluating Ru etching performance described above, a ruthenium layer removal treatment was performed on a substrate on which a ruthenium layer having a thickness of 15 nm was formed. At a point in time when the removal treatment had been performed for half of the time required for the ruthenium layer to disappear, the removal treatment was stopped, the surface of the ruthenium layer was observed with a scanning electron microscope, and the smoothness of the portion to be treated was evaluated based on the following standard.

A: The surface of the ruthenium layer is smooth and has no roughness.

B: The surface of the ruthenium layer is rough, but the roughness is at an acceptable level.

<Amount of Particles>

The amount of particles in the chemical solution was measured using a particle counter (KS-42A manufactured by RION Co., Ltd.), and the amount of particles in the chemical solution was evaluated based on to the following standard.

A: Substantially no particles are present in the chemical solution.

B: There are many particles in the chemical solution, although the amount thereof is at an acceptable level.

The following Table 3 shows the test conditions and results.

In Table 3, ppm, ppb, and ppt described as units mean ppm by mass, ppb by mass, and ppt by mass respectively.

In Table 3, the field of "Content" in the fields of "Metal component" and "Ammonium ions and anionic species" shows the content (mass ratio) of each component with respect to the total mass of the periodic acids.

In Table 3, the field of "Filtration" shows whether or not the aqueous solution treated by the ion exchange method was further subjected to filtration (the step B). A means that filtration (step B) was performed, and B means that filtration (step B) was not performed.

In Table 3, the description of "Balance" in the field of "Content" for "Water" shows that the rest of the components other than water described in the table is water.

In Table 3, the description of "Adjusted" in the field of "Content" for "pH adjuster" shows that the chemical solution includes a pH adjuster in such an amount that the chemical solution had a predetermined pH (4.0, 6.0, or 9.0).

There was no change in the content of orthoperiodic acid in the aqueous solution before and after performing various purification treatments. For example, in the aqueous solution which was used for preparing Example Y3 and obtained by the same treatment as that in Example X1, the content of orthoperiodic acid in the aqueous solution with respect to the total mass of the aqueous solution remained at 37% by mass before and after the treatment.

Furthermore, in Examples Y16 to Y27, the pH of the aqueous solution did not change before and after the purification treatment was performed on the aqueous solution to which various pH adjusters were added.

TABLE 12

| | Water Content | Periodic acids Type | Content (% by mass) | pH adjuster Type | pH adjuster Content | pH of chemical solution | Metal component Type | Metal component Content | Metal component Type | Metal component Content |
|---|---|---|---|---|---|---|---|---|---|---|
| Example Y1 | Balance | Orthoperiodic acid | 37 | | | 1.0 | Ti | 100 ppb | | |
| Example Y2 | Balance | Orthoperiodic acid | 37 | | | 1.0 | | | Zr | 100 ppb |
| Example Y3 | Balance | Orthoperiodic acid | 37 | | | 1.0 | Ti | 100 ppb | Zr | 100 ppb |
| Example Y4 | Balance | Orthoperiodic acid | 37 | | | 1.0 | Ti | 100 ppb | | |
| Example Y5 | Balance | Orthoperiodic acid | 37 | | | 1.0 | | | Zr | 100 ppb |
| Example Y6 | Balance | Orthoperiodic acid | 37 | | | 1.0 | Ti | 100 ppb | Zr | 100 ppb |
| Example Y7 | Balance | Orthoperiodic acid | 37 | | | 1.0 | Ti | 10 ppb | | |
| Example Y8 | Balance | Orthoperiodic acid | 37 | | | 1.0 | | | Zr | 10 ppb |
| Example Y9 | Balance | Orthoperiodic acid | 37 | | | 1.0 | Ti | 10 ppb | Zr | 10 ppb |

TABLE 12-continued

| | | | | | | | | | | | |
|---|---|---|---|---|---|---|---|---|---|---|---|
| Example Y10 | Balance | Orthoperiodic acid | 37 | | | 1.0 | Ti | 1 ppb | | | |
| Example Y11 | Balance | Orthoperiodic acid | 37 | | | 1.0 | | | Zr | 1 | ppb |
| Example Y12 | Balance | Orthoperiodic acid | 37 | | | 1.0 | Ti | 1 ppb | Zr | 1 | ppb |
| Example Y13 | Balance | Orthoperiodic acid | 5 | | | 1.0 | Ti | 10 ppb | | | |
| Example Y14 | Balance | Orthoperiodic acid | 5 | | | 1.0 | | | Zr | 10 | ppb |
| Example Y15 | Balance | Orthoperiodic acid | 5 | | | 1.0 | Ti | 10 ppb | Zr | 10 | ppb |
| Example Y16 | Balance | Orthoperiodic acid | 5 | TEAH | Adjusted | 4.0 | Ti | 3 ppb | Zr | 3 | ppb |
| Example Y17 | Balance | Orthoperiodic acid | 5 | TEAH | Adjusted | 6.0 | Ti | 1 ppb | Zr | 1 | ppb |
| Example Y18 | Balance | Orthoperiodic acid | 5 | TEAH | Adjusted | 9.0 | Ti | 3 ppb | Zr | 3 | ppb |

| | Ammonium ions or anionic species | | Step B | Evaluation | | | | | |
|---|---|---|---|---|---|---|---|---|---|
| | Type | Content | | Residual metal inhibition properties | Etching performance for Ru | Etching performance for Co | Etching performance for W | Smoothness | Amount of particles |
| Example Y1 | | | A | D | C | C | C | B | A |
| Example Y2 | | | A | D | C | C | C | B | A |
| Example Y3 | | | A | D | C | C | C | B | A |
| Example Y4 | | | B | D | C | C | C | B | B |
| Example Y5 | | | B | D | C | C | C | B | B |
| Example Y6 | | | B | D | C | C | C | B | B |
| Example Y7 | | | A | C | C | C | C | B | A |
| Example Y8 | | | A | C | C | C | C | B | A |
| Example Y9 | | | A | C | C | C | C | B | A |
| Example Y10 | | | A | B | C | C | C | B | A |
| Example Y11 | | | A | B | C | C | C | B | A |
| Example Y12 | | | A | B | C | C | C | B | A |
| Example Y13 | | | A | C | C | C | C | B | A |
| Example Y14 | | | A | C | C | C | C | B | A |
| Example Y15 | | | A | C | C | C | C | B | A |
| Example Y16 | | | A | B | B | B | B | B | A |
| Example Y17 | | | A | B | B | B | B | B | A |
| Example Y18 | | | A | B | B | B | B | B | A |

TABLE 13

| | Water Content | Periodic acids Type | Content (% by mass) | pH adjuster Type | Content | pH of chemical solution | Metal component Type | Content | Type | Content |
|---|---|---|---|---|---|---|---|---|---|---|
| Example Y19 | Balance | Orthoperiodic acid | 5 | TMAH | Adjusted | 4.0 | Ti | 3 ppb | Zr | 3 ppb |
| Example Y20 | Balance | Orthoperiodic acid | 5 | TMAH | Adjusted | 6.0 | Ti | 1 ppb | Zr | 1 ppb |
| Example Y21 | Balance | Orthoperiodic acid | 5 | TMAH | Adjusted | 9.0 | Ti | 3 ppb | Zr | 3 ppb |
| Example Y22 | Balance | Orthoperiodic acid | 5 | TBAH | Adjusted | 4.0 | Ti | 3 ppb | Zr | 3 ppb |
| Example Y23 | Balance | Orthoperiodic acid | 5 | TBAH | Adjusted | 6.0 | Ti | 1 ppb | Zr | 1 ppb |

TABLE 13-continued

| | | | | | | | | | | | | |
|---|---|---|---|---|---|---|---|---|---|---|---|---|
| Example Y24 | Balance | Orthoperiodic acid | 5 | TBAH | Adjusted | 9.0 | Ti | 3 ppb | Zr | 3 ppb |
| Example Y25 | Balance | Orthoperiodic acid | 5 | DBU | Adjusted | 4.0 | Ti | 3 ppb | Zr | 3 ppb |
| Example Y26 | Balance | Orthoperiodic acid | 5 | DBU | Adjusted | 6.0 | Ti | 1 ppb | Zr | 1 ppb |
| Example Y27 | Balance | Orthoperiodic acid | 5 | DBU | Adjusted | 9.0 | Ti | 3 ppb | Zr | 3 ppb |
| Example Y28 | Balance | Orthoperiodic acid | 37 | | | 1.0 | Ti | 10 ppb | Zr | 10 ppb |
| Example Y29 | Balance | Orthoperiodic acid | 37 | | | 1.0 | Ti | 10 ppb | Zr | 10 ppb |
| Example Y30 | Balance | Orthoperiodic acid | 37 | | | 1.0 | Ti | 10 ppb | Zr | 10 ppb |
| Comparative Example Y1 | Balance | Orthoperiodic acid | 37 | | | 1.0 | Ti | 200 ppm | Zr | 200 ppm |
| Comparative Example Y2 | Balance | Orthoperiodic acid | 37 | | | 1.0 | Ti | 200 ppm | Zr | 200 ppm |
| Comparative Example Y3 | Balance | Orthoperiodic acid | 37 | | | 1.0 | Ti | 0.1 ppt | Zr | 0.1 ppt |
| Comparative Example Y4 | Balance | Orthoperiodic acid | 37 | | | 1.0 | Ti | 200 ppm | | |
| Comparative Example Y5 | Balance | Orthoperiodic acid | 37 | | | | | | Zr | 200 ppm |

| | Ammonium ions or anionic species | | Step B | Evaluation | | | | | |
|---|---|---|---|---|---|---|---|---|---|
| | Type | Content | | Residual metal inhibition properties | Etching performance for Ru | Etching performance for Co | Etching performance for W | Smoothness | Amount of particles |
| Example Y19 | | | A | B | B | B | B | B | A |
| Example Y20 | | | A | B | B | B | B | B | A |
| Example Y21 | | | A | B | B | B | B | B | A |
| Example Y22 | | | A | B | B | B | B | B | A |
| Example Y23 | | | A | B | B | B | B | B | A |
| Example Y24 | | | A | B | B | B | B | B | A |
| Example Y25 | | | A | B | B | B | B | B | A |
| Example Y26 | | | A | B | B | B | B | B | A |
| Example Y27 | | | A | B | B | B | B | B | A |
| Example Y28 | $NH_4$ | 1 ppm | A | C | A | A | A | B | A |
| Example Y29 | $I^-$, $I_3^-$, $IO_3^-$, $Br^-$, $Cl^-$, $NO_3^-$, sulfate ion, sulfite ion, phosphate ion, phosphite ion | 1 ppm | A | C | C | C | C | A | A |
| Example Y30 | $IO_3^-$ | 1 ppm | A | C | C | C | C | A | A |
| Comparative Example Y1 | | | A | E | B | B | B | B | A |
| Comparative Example Y2 | | | B | E | B | B | B | B | B |
| Comparative Example Y3 | | | A | A | D | D | D | B | A |
| Comparative Example Y4 | | | A | E | B | B | B | B | A |
| Comparative Example Y5 | | | A | E | B | B | B | B | A |

From the results shown in Table 3, it has been confirmed that the chemical solution according to the embodiment of the present invention demonstrates excellent etching performance for transition metal-containing substances and has excellent defect inhibition performance.

It has been confirmed that in a case where the chemical solution includes a predetermined amount of $NH_4^+$, the chemical solution demonstrates further improved etching performance for transition metal-containing substances (result of Example Y28).

It has been confirmed that in a case where the chemical solution includes a predetermined amount of anionic species, the portion to be treated exhibits better smoothness after the etching treatment (the results of Examples Y29 and Y30).

It has been confirmed that in a case where filtration is performed in addition to the ion exchange method performed on the aqueous solution as a substance to be purified in the method for manufacturing a chemical solution according to the embodiment of the present invention, the amount of particles in the obtained chemical solution can be reduced (the results of Examples Y4 to Y6).

It has been confirmed that in a case where the chemical solution includes a pH adjuster, the etching performance for various transition metal-containing substances is further improved (the results of Examples Y15 to Y27). Furthermore, it has been confirmed that such a chemical solution can also be obtained by adding a pH adjuster to the aqueous solution as a substance to be purified (step C) before performing the ion exchange method in the method for manufacturing a chemical solution according to the embodiment of the present invention.

It has been confirmed that in a case where the pH of the chemical solution is 4.0 to 9.0, the etching performance for transition metal-containing substances is further improved (the results of Examples Y15 to Y27).

It has been confirmed that in view of further improving the residual metal inhibition properties (defect inhibition properties), the content of all of the first metal component in the chemical solution with respect to the total mass of the periodic acids is more preferably equal to or smaller than 10 ppb by mass, and even more preferably equal to or smaller than 5 ppb by mass (the results of Examples Y1 to Y15).

Example Z

By using a chemical solution, a test was performed to evaluate whether the chemical solution is suitable for simultaneously removing two or more kinds of transition metal-containing substances on a substrate.

[Preparation of Chemical Solution]

An aqueous solution (substance to be purified) including periodic acid or the like was treated, thereby obtaining a chemical solution to be used in Example Z.

The raw materials used for preparing the aqueous solution are as follows.

Water: ultrapure water (ultrapure water manufactured by an ultrapure water manufacturing device "PURELAB Ultra" (manufactured by ORGANO CORPORATION))

Orthoperiodic acid: reagent A (orthoperiodic acid including Ti and Zr)

(pH Adjuster)

TMAH: Tetramethylammonium hydroxide
TEAH: Tetraethylammonium hydroxide
KOH: potassium hydroxide
$(C_2H_5)_3N(OH)CH_3$: triethylmethylammonium hydroxide
$(C_3H_7)_2N(OH)(CH_3)_2$: dimethyldipropylammonium hydroxide
$HNO_3$: nitric acid All the pH adjusters used were classified as a semiconductor grade.

(Carboxylic Acid Compound)

DTPA: Diethylene Triamine Pentaacetic Acid
Citric acid
Phthalic acid (ortho form)
Oxalic acid
Acetic acid
Glycolic acid (Water-Soluble Organic Solvent)

DEGEE: Diethylene glycol diethyl ether (Preparation of Aqueous Solution (Substance to be Purified))

The aforementioned orthoperiodic acid and a pH adjuster, which is used as desired, were dissolved in water, thereby preparing an aqueous solution.

(Preparation of Chemical Solution)

Thereafter, the aqueous solution was subjected to a treatment by an ion exchange method and a filtration treatment (Step B) with reference to Example X, and either or both of a water-soluble organic solvent and a carboxylic acid compound were added thereto as desired, thereby obtaining a chemical solution having the formulation shown in Table 4.

In Table 4, the content of Ti and Zr in each chemical solution was the amount corresponding to "C" in the evaluation standard for the content of Ti and Zr shown in Example X.

In Table 4, the description of "Balance" in the field of "Content" for "Water" shows that the rest of the components other than water described in the table is water.

The description of "Adjusted" in the field of "Content" for "pH adjuster" shows that the chemical solution includes a pH adjuster in such an amount that the chemical solution had a predetermined pH.

[Test and Evaluation]

(Evaluation of Etching Performance (Etching Rate))

A wafer with a film having a Ru film or a Cu film was immersed for 10 minutes in a chemical solution at the temperature shown in Table 4, then rinsed with water, and dried over nitrogen.

Before and after the treatment, the change in the thickness of the Ru film or Cu film on the wafer was measured by a four-terminal method, and the etching rate of the chemical solution for Ru or Cu was calculated.

The Ru film of the wafer used for the evaluation is a Ru film formed by a physical vapor deposition (PVD) method, and the Cu film is a Cu film formed by an electrolytic plating (ECD) method.

(Evaluation of Surface Properties (Cu Surface Oxidation) of Portion to be Treated)

After the evaluation of the etching rate, the Cu film of the wafer with a Cu film was visually observed to investigate whether or not the Cu film was discolored before and after the treatment. In a case where the Cu film is found to be discolored, the surface has been oxidized, and the surface properties of the portion to be treated are poor. The results of the visual observation were evaluated according to the following standard.

A: No discoloration (oxidation) has occurred on the Cu film.

B: Although the Cu film has been slightly discolored (oxidized), the wafer can be put to practical use.

C: The Cu film has been discolored (oxidized), and the wafer is problematic for practical use.

(Simultaneous Removal of Cu and Ru)

A patterned wafer was prepared which had an interlayer insulating film having a groove, TiN having a film thickness of 3 nm (barrier metal layer) disposed along the inner wall of the groove, Ru having a film thickness of 3 nm (liner layer) disposed along the inside of the TiN, and Cu (wiring, line width: 45 nm) filling up the inside of the Ru.

The patterned wafer was immersed in a chemical solution at the temperature shown in Table 4, thereby removing Cu on the patterned wafer by 15 nm from the wafer surface. Thereafter, a rinsing treatment was performed by immersing the wafer for 1 minute in a 1% by mass aqueous citric acid solution (rinsing solution) at 25° C.

Flatness of Cu

The treated wafer was observed with a scanning electron microscope (SEM), and evaluated according to the following standard.

A: The surface roughness of Cu (wiring) does not increase before and after etching.

B: Although the surface roughness of Cu (wiring) slightly increases before and after etching, the wafer can be put to practical use.

C: The surface roughness of Cu (wiring) increases before and after etching, and the wafer is problematic for practical use.

Removal of Ru

The treated patterned wafer was observed with a transmission electron microscope (TEM) so as to check whether Ru (liner layer) was removed together with Cu (wiring). In a case where Ru was removed, the wafer was evaluated as OK, and in a case where Ru was not removed, the wafer was evaluated as NG.

Table 4 shows the results.

TABLE 14

| | Composition of chemical solution | | | | | | | |
|---|---|---|---|---|---|---|---|---|
| | Chemical agent | | pH adjuster | | Carboxylic acid compound | | Water-soluble organic solvent | |
| | Type | Content (% by mass) | Type | Content | Type | Content (% by mass) | Type | Content (% by mass) |
| Example Z1 | $H_5IO_6$ | 2.0 | TMAH | Adjusted | | | | |
| Example Z2 | $H_5IO_6$ | 2.0 | TMAH | Adjusted | | | | |
| Example Z3 | $H_5IO_6$ | 2.0 | TEAH | Adjusted | | | | |
| Example Z4 | $H_5IO_6$ | 2.0 | KOH | Adjusted | | | | |
| Example Z5 | $H_5IO_6$ | 1.0 | TMAH | Adjusted | | | | |
| Example Z6 | $H_5IO_6$ | 2.0 | TMAH | Adjusted | | | | |
| Example Z7 | $H_5IO_6$ | 3.0 | TMAH | Adjusted | | | | |
| Example Z8 | $H_5IO_6$ | 3.0 | TMAH | Adjusted | | | | |
| Example Z9 | $H_5IO_6$ | 6.0 | TMAH | Adjusted | | | | |
| Example Z10 | $H_5IO_6$ | 6.0 | TMAH | Adjusted | | | | |
| Example Z11 | $H_5IO_6$ | 6.0 | TMAH | Adjusted | | | | |
| Example Z12 | $H_5IO_6$ | 6.0 | TMAH | Adjusted | | | | |
| Example Z13 | $H_5IO_6$ | 6.0 | TMAH | Adjusted | | | | |
| Example Z14 | $H_5IO_6$ | 6.0 | TMAH | Adjusted | | | | |
| Example Z15 | $H_5IO_6$ | 6.0 | TMAH | Adjusted | | | | |
| Example Z16 | $H_5IO_6$ | 1.0 | TEAH | Adjusted | | | | |
| Example Z17 | $H_5IO_6$ | 1.0 | TEAH | Adjusted | | | | |
| Example Z18 | $H_5IO_6$ | 1.0 | TEAH | Adjusted | | | | |
| Example Z19 | $H_5IO_6$ | 3.0 | $(C_2H_5)_3N(OH)CH_3$ | Adjusted | | | | |
| Example Z20 | $H_5IO_6$ | 3.0 | $(C_3H_7)_2N(OH)(CH_3)_2$ | Adjusted | | | | |
| Example Z21 | $H_5IO_6$ | 2.0 | TMAH | Adjusted | DTPA | 0.1 | DEGDEE | 10.0 |
| Example Z22 | $H_5IO_6$ | 2.0 | TMAH | Adjusted | Citric acid | 0.1 | DEGDEE | 10.0 |
| Example Z23 | $H_5IO_6$ | 2.0 | TEAH | Adjusted | Phthalic acid | 0.5 | | |
| Example Z24 | $H_5IO_6$ | 2.0 | TMAH | Adjusted | Oxalic acid | 0.1 | DEGDEE | 10.0 |
| Example Z25 | $H_5IO_6$ | 2.0 | TMAH | Adjusted | Phthalic acid | 0.5 | | |
| Example Z26 | $H_5IO_6$ | 2.0 | TMAH | Adjusted | Citric acid | 0.5 | | |
| Example Z27 | $H_5IO_6$ | 2.0 | TMAH | TMAH | Oxalic acid | 0.5 | | |
| Example Z28 | $H_5IO_6$ | 2.0 | TMAH | TMAH | Acetic acid | 0.5 | | |
| Example Z29 | $H_5IO_6$ | 2.0 | TMAH | Adjusted | Glycolic acid | 0.5 | | |

| | Composition of chemical solution | | | | Processing | Etching rate (Å/min) | | Evaluation result | | |
|---|---|---|---|---|---|---|---|---|---|---|
| | Ti Content | Zr Content | Water Content | pH of chemical solution | temperature (°C.) | Ru | Cu | Surface oxidation of Cu | Flatness of Cu | Removal of Ru |
| Example Z1 | C | C | Balance | 8.5 | 22 | 63 | 106 | A | A | OK |
| Example Z2 | C | C | Balance | 8.5 | 40 | 112 | 123 | A | A | OK |
| Example Z3 | C | C | Balance | 8.5 | 22 | 57 | 100 | A | A | OK |
| Example Z4 | C | C | Balance | 8.5 | 30 | 88 | 79 | B | B | OK |
| Example Z5 | C | C | Balance | 8.5 | 50 | 133 | 89 | B | B | OK |
| Example Z6 | C | C | Balance | 8.5 | 50 | 212 | 106 | A | A | OK |
| Example Z7 | C | C | Balance | 8.5 | 50 | 350 | 127 | A | A | OK |
| Example Z8 | C | C | Balance | 9.0 | 50 | 77 | 78 | A | A | OK |
| Example Z9 | C | C | Balance | 7.5 | 50 | 312 | 432 | A | A | OK |
| Example Z10 | C | C | Balance | 8.0 | 50 | 317 | 193 | A | A | OK |
| Example Z11 | C | C | Balance | 8.5 | 50 | 457 | 154 | A | A | OK |
| Example Z12 | C | C | Balance | 9.0 | 50 | 381 | 154 | A | A | OK |
| Example Z13 | C | C | Balance | 9.5 | 50 | 111 | 101 | A | A | OK |
| Example Z14 | C | C | Balance | 10.1 | 50 | 65 | 83 | A | A | OK |
| Example Z15 | C | C | Balance | 10.8 | 50 | 51 | 69 | A | A | OK |
| Example Z16 | C | C | Balance | 8.9 | 60 | 66 | 62 | B | B | OK |
| Example Z17 | C | C | Balance | 3.4 | 22 | 85 | 60 | B | B | OK |
| Example Z18 | C | C | Balance | 6.8 | 22 | 75 | 61 | B | B | OK |
| Example Z19 | C | C | Balance | 9.4 | 60 | 55 | 57 | A | A | OK |
| Example Z20 | C | C | Balance | 9.8 | 60 | 57 | 60 | A | A | OK |
| Example Z21 | C | C | Balance | 8.5 | 22 | 65 | 111 | A | A | OK |
| Example Z22 | C | C | Balance | 8.5 | 40 | 130 | 150 | A | A | OK |
| Example Z23 | C | C | Balance | 8.5 | 22 | 63 | 103 | A | A | OK |
| Example Z24 | C | C | Balance | 8.5 | 30 | 88 | 79 | A | A | OK |
| Example Z25 | C | C | Balance | 8.5 | 40 | 142 | 126 | A | A | OK |
| Example Z26 | C | C | Balance | 8.5 | 40 | 110 | 131 | A | A | OK |
| Example Z27 | C | C | Balance | 8.5 | 40 | 76 | 142 | A | A | OK |
| Example Z28 | C | C | Balance | 8.5 | 40 | 208 | 144 | A | A | OK |
| Example Z29 | C | C | Balance | 8.5 | 40 | 123 | 173 | A | A | OK |

From the results shown in Table 4, it has been confirmed that the chemical solution according to the embodiment of the present invention is also suitable for being used to simultaneously remove two or more kinds of transition metal-containing substances (particularly, a Cu-containing substance and a Ru-containing substance).

It has been confirmed that in a case where the content of periodic acids is 4% to 40% by mass with respect to the total mass of the chemical solution, the etching performance is further improved (comparison between Examples Z7 and Z11 and the like).

It has been confirmed that in a case where the pH adjuster is a quaternary ammonium salt compound, the flatness of the portion to be treated is further improved (comparison between Examples Z3 and Z4 and the like).

(Evaluation of Rinsing Solution)

The patterned wafer was subjected to the same treatment as the treatment of simultaneously removing Cu and Ru in Example Z11, except that the rinsing solution was changed to 1% by mass hydrochloric acid or 1% by mass aqueous ammonia.

The treated patterned wafer was observed with SEM, and the result of the rinsing treatment was evaluated according to the following standard.

A: No residue is found.
B: Residues derived from Cu are found in a portion of the lateral wall of the barrier metal layer.
C: Residues derived from Cu are found on the lateral wall of the barrier metal layer and in a portion of Cu (wiring).
D: Residues derived from Cu are found on the lateral wall of the barrier metal layer and in the entire Cu (wiring).

The results of the evaluation will be shown below.

| Example | Rinsing solution | Evaluation |
|---|---|---|
| Example Z11 | 1% by mass aqueous citric acid solution | A |
| Example Z11-2 | 1% by mass hydrochloric acid | B |
| Example Z11-3 | 1% by mass aqueous TMAH solution | C |

In Examples Z11, Z11-2, and Z11-3, all of the evaluation results of "Flatness of Cu" and "Removal of Ru" were the same.

From the results described above, it has been confirmed that the rinsing solution is preferably an acidic rinsing solution, and more preferably an aqueous citric acid solution.

In addition, by using the chemical solutions of Example Z, the same evaluation as the evaluation of residual metal inhibition properties in Example Y was carried out. As a result, all of the chemical solutions attained grades equal to or higher than D.

EXPLANATION OF REFERENCES

10a: wiring substrate not yet being subjected to recess etching treatment for wiring
10b: wiring substrate having undergone recess etching treatment for wiring
12: interlayer insulating film
14: barrier metal layer
16: transition metal-containing wiring
18: recess portion
20, 30: object to be treated
22: substrate
24: transition metal-containing film
26: outer edge portion

What is claimed is:

1. A chemical solution comprising:
one or more kinds of periodic acids selected from the group consisting of a periodic acid and a salt thereof;
a first metal component which is Zr; and
water,
wherein a content of the first metal component is 1 ppt by mass to 100 ppm by mass with respect to a total mass of the periodic acids in the chemical solution.

2. The chemical solution according to claim 1, wherein a content of the first metal component is 1 ppb by mass to 100 ppb by mass with respect to the total mass of the periodic acids in the chemical solution.

3. The chemical solution according to claim 1, further comprising: a pH adjuster.

4. The chemical solution according to claim 1 that has a pH of 4.0 to 9.0.

5. The chemical solution according to claim 1 that has a pH of 7.5 to 10.0.

6. The chemical solution according to claim 1, wherein a content of the periodic acids is 0.0001% to 50% by mass with respect to a total mass of the chemical solution.

7. The chemical solution according to claim 1, further comprising:
one or more kinds of second metal components selected from the group consisting of Al, Ag, B, Ba, Ca, Cd, Co, Cr, Cu, Fe, K, Li, Mg, Mn, Na, Ni, Pb, Ru, Sn, and Zn,
wherein in a case where the chemical solution includes one kind of second metal component, a content of the one kind of second metal component is 1 ppt by mass to 100 ppm by mass with respect to the total mass of the periodic acids in the chemical solution, and
in a case where the chemical solution includes two or more kinds of second metal components, a content of all of the two or more kinds of second metal components is equal to or smaller than 100 ppm by mass with respect to the total mass of the periodic acids in the chemical solution, and a content of at least one of the two or more kinds of second metal components is equal to or greater than 1 ppt by mass with respect to the total mass of the periodic acids in the chemical solution.

8. The chemical solution according to claim 1, further comprising:
ammonium ions,
wherein a content of the ammonium ions is 1 ppt by mass to 100 ppm by mass with respect to the total mass of the periodic acids in the chemical solution.

9. The chemical solution according to claim 1, further comprising:
one or more kinds of anionic species selected from the group consisting of $I^-$, $I_3^-$, $IO_3^-$, $Br^-$, $Cl^-$, $NO_3^-$, a sulfate ion, a sulfite ion, a phosphate ion, and a phosphite ion,
wherein in a case where the chemical solution includes one kind of anionic species, a content of the one kind of anionic species is 1 ppt by mass to 100 ppm by mass with respect to the total mass of the periodic acids in the chemical solution, and
in a case where the chemical solution includes two or more kinds of anionic species, a content of all of the two or more kinds of anionic species is equal to or smaller than 100 ppm by mass with respect to the total mass of the periodic acids in the chemical solution, and a content of at least one of the two or more kinds of anionic species is equal to or greater than 1 ppt by mass with respect to the total mass of the periodic acids in the chemical solution.

10. The chemical solution according to claim 9, wherein the anionic species is $IO_3^-$.

11. A method for manufacturing a chemical solution, comprising:
a step A of performing an ion exchange method on a substance to be purified, which includes one or more kinds of periodic acids selected from the group consisting of a periodic acid and a salt thereof, a first metal component which is Zr, and water, so as to obtain the chemical solution according to claim 1.

12. The method for manufacturing a chemical solution according to claim 11,
wherein the ion exchange method includes one or more kinds of methods selected from the group consisting of a method A1 of passing the substance to be purified through a first filled portion filled with a mixed resin including a cation exchange resin and an anion exchange resin,
a method A2 of passing the substance to be purified through at least one kind of filled portion among a second filled portion filled with a cation exchange resin, a third filled portion filled with an anion exchange resin, and a fourth filled portion filled with a chelating resin, and
a method A3 of passing the substance to be purified through a membranous ion exchanger.

13. The method for manufacturing a chemical solution according to claim 12,
wherein the method A1 is a method of passing the substance to be purified through two or more of the first filled portions.

14. The method for manufacturing a chemical solution according to claim 12,
wherein the method A2 is a method of passing the substance to be purified through two or more of the second filled portions and two or more of the third filled portions, or
a method of passing the substance to be purified through one or more of the second filled portions and one or more of the fourth filled portions.

15. The method for manufacturing a chemical solution according to claim 12,
wherein the method A3 is a method of passing the substance to be purified through two or more membranous ion exchangers.

16. The method for manufacturing a chemical solution according to claim 12,
wherein the ion exchange method includes two or more kinds of methods selected from the group consisting of the method A1, the method A2, and the method A3.

17. The method for manufacturing a chemical solution according to claim 11, further comprising:
a step B of filtering the substance to be purified having undergone the step A by using a filter after the step A.

18. The method for manufacturing a chemical solution according to claim 11, further comprising:
a step C of mixing the substance to be purified with a pH adjuster before the step A.

19. A method for treating a substrate, comprising:
a step D of removing a transition metal-containing substance on a substrate by using the chemical solution according to claim 1.

20. The method for treating a substrate according to claim 19,
wherein in the step D, two or more kinds of transition metal-containing substances on the substrate are simultaneously removed.

21. The method for treating a substrate according to claim 20,
wherein the two or more kinds of transition metal-containing substances include at least a Ru-containing substance and a Cu-containing substance.

22. The method for treating a substrate according to claim 19, further comprising:
performing a rinsing treatment on the substrate obtained by the step D by using a rinsing solution after the step D.

23. The method for treating a substrate according to claim 22,
wherein the rinsing solution is an acidic rinsing solution.

24. A chemical solution comprising:
one or more kinds of periodic acids selected from the group consisting of a periodic acid and a salt thereof;
two kinds of first metal components selected from the group consisting of Ti and Zr; and
water,
wherein a content of both the two kinds of first metal components is equal to or smaller than 100 ppm by mass with respect to the total mass of the periodic acids in the chemical solution, and a content of at least one of the two kinds of first metal components is equal to or greater than 1 ppt by mass with respect to the total mass of the periodic acids in the chemical solution.

25. The chemical solution according to claim 24,
wherein a content of both the two kinds of first metal components is equal to or smaller than 100 ppb by mass with respect to the total mass of the periodic acids in the chemical solution, and a content of at least one of the two kinds of first metal components is equal to or greater than 1 ppb by mass with respect to the total mass of the periodic acids in the chemical solution.

26. The chemical solution according to claim 24, further comprising: a pH adjuster.

27. The chemical solution according to claim 24 that has a pH of 4.0 to 9.0.

28. The chemical solution according to claim 24 that has a pH of 7.5 to 10.0.

29. The chemical solution according to claim 24,
wherein a content of the periodic acids is 0.0001% to 50% by mass with respect to a total mass of the chemical solution.

30. The chemical solution according to claim 24, further comprising:
one or more kinds of second metal components selected from the group consisting of Al, Ag, B, Ba, Ca, Cd, Co, Cr, Cu, Fe, K, Li, Mg, Mn, Na, Ni, Pb, Ru, Sn, and Zn,
wherein in a case where the chemical solution includes one kind of second metal component, a content of the one kind of second metal component is 1 ppt by mass to 100 ppm by mass with respect to the total mass of the periodic acids in the chemical solution, and
in a case where the chemical solution includes two or more kinds of second metal components, a content of all of the two or more kinds of second metal components is equal to or smaller than 100 ppm by mass with respect to the total mass of the periodic acids in the chemical solution, and a content of at least one of the two or more kinds of second metal components is equal to or greater than 1 ppt by mass with respect to the total mass of the periodic acids in the chemical solution.

31. The chemical solution according to claim 24, further comprising:
ammonium ions,
wherein a content of the ammonium ions is 1 ppt by mass to 100 ppm by mass with respect to the total mass of the periodic acids in the chemical solution.

32. The chemical solution according to claim 24, further comprising:
one or more kinds of anionic species selected from the group consisting of $I^-$, $I_3^-$, $IO_3^-$, $Br^-$, $Cl^-$, $NO_3^-$, a sulfate ion, a sulfite ion, a phosphate ion, and a phosphite ion,
wherein in a case where the chemical solution includes one kind of anionic species, a content of the one kind of anionic species is 1 ppt by mass to 100 ppm by mass with respect to the total mass of the periodic acids in the chemical solution, and
in a case where the chemical solution includes two or more kinds of anionic species, a content of all of the two or more kinds of anionic species is equal to or smaller than 100 ppm by mass with respect to the total mass of the periodic acids in the chemical solution, and a content of at least one of the two or more kinds of anionic species is equal to or greater than 1 ppt by mass with respect to the total mass of the periodic acids in the chemical solution.

33. The chemical solution according to claim 32,
wherein the anionic species is $IO_3^-$.

34. A method for manufacturing a chemical solution, comprising:
a step A of performing an ion exchange method on a substance to be purified, which includes one or more kinds of periodic acids selected from the group consisting of a periodic acid and a salt thereof, two kinds of first metal components selected from the group consisting of Ti and Zr, and water, so as to obtain the chemical solution according to claim 24.

35. The method for manufacturing a chemical solution according to claim 34,
wherein the ion exchange method includes one or more kinds of methods selected from the group consisting of a method A1 of passing the substance to be purified through a first filled portion filled with a mixed resin including a cation exchange resin and an anion exchange resin,
a method A2 of passing the substance to be purified through at least one kind of filled portion among a second filled portion filled with a cation exchange resin, a third filled portion filled with an anion exchange resin, and a fourth filled portion filled with a chelating resin, and
a method A3 of passing the substance to be purified through a membranous ion exchanger.

36. The method for manufacturing a chemical solution according to claim 35,
wherein the method A1 is a method of passing the substance to be purified through two or more of the first filled portions.

37. The method for manufacturing a chemical solution according to claim 35,
wherein the method A2 is a method of passing the substance to be purified through two or more of the second filled portions and two or more of the third filled portions, or
a method of passing the substance to be purified through one or more of the second filled portions and one or more of the fourth filled portions.

38. The method for manufacturing a chemical solution according to claim 35,
wherein the method A3 is a method of passing the substance to be purified through two or more membranous ion exchangers.

39. The method for manufacturing a chemical solution according to claim 35,
wherein the ion exchange method includes two or more kinds of methods selected from the group consisting of the method A1, the method A2, and the method A3.

40. The method for manufacturing a chemical solution according to claim 34, further comprising:
a step B of filtering the substance to be purified having undergone the step A by using a filter after the step A.

41. The method for manufacturing a chemical solution according to claim 34, further comprising:
a step C of mixing the substance to be purified with a pH adjuster before the step A.

42. A method for treating a substrate, comprising:
a step D of removing a transition metal-containing substance on a substrate by using the chemical solution according to claim 24.

43. The method for treating a substrate according to claim 42,
wherein in the step D, two or more kinds of transition metal-containing substances on the substrate are simultaneously removed.

44. The method for treating a substrate according to claim 43,
wherein the two or more kinds of transition metal-containing substances include at least a Ru-containing substance and a Cu-containing substance.

45. The method for treating a substrate according to claim 42, further comprising:
performing a rinsing treatment on the substrate obtained by the step D by using a rinsing solution after the step D.

46. The method for treating a substrate according to claim 45,
wherein the rinsing solution is an acidic rinsing solution.

* * * * *